(12) United States Patent
Kanzawa et al.

(10) Patent No.: US 8,391,051 B2
(45) Date of Patent: Mar. 5, 2013

(54) METHOD OF PROGRAMMING NONVOLATILE MEMORY ELEMENT

(75) Inventors: Yoshihiko Kanzawa, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 183 days.

(21) Appl. No.: 13/001,840

(22) PCT Filed: Apr. 9, 2010

(86) PCT No.: PCT/JP2010/002591
§ 371 (c)(1),
(2), (4) Date: Dec. 29, 2010

(87) PCT Pub. No.: WO2010/116754
PCT Pub. Date: Oct. 14, 2010

(65) Prior Publication Data
US 2011/0110143 A1    May 12, 2011

(30) Foreign Application Priority Data
Apr. 10, 2009    (JP) ................................. 2009-095803

(51) Int. Cl.
*G11C 11/00*    (2006.01)
(52) U.S. Cl. ........................................ 365/148; 365/158
(58) Field of Classification Search .................. 365/148, 365/158
See application file for complete search history.

(56) References Cited

U.S. PATENT DOCUMENTS

| 8,116,115 B2 * | 2/2012 | Liu et al. ........................ 365/148 |
| 2005/0275064 A1 | 12/2005 | Li et al. |
| 2006/0023497 A1 | 2/2006 | Kawazoe et al. |
| 2006/0097288 A1 | 5/2006 | Baek et al. |
| 2006/0158948 A1 | 7/2006 | Fuji |
| 2007/0195581 A1 | 8/2007 | Morimoto |
| 2007/0206410 A1 * | 9/2007 | Sutardja ........................ 365/163 |
| 2007/0221975 A1 | 9/2007 | Li et al. |
| 2008/0117664 A1 | 5/2008 | Kinoshita et al. |

(Continued)

FOREIGN PATENT DOCUMENTS

| JP | 2005-340806 | 12/2005 |
| JP | 2006-066052 | 3/2006 |

(Continued)

OTHER PUBLICATIONS

International Search Report issued Jul. 27, 2010 in International (PCT) Application No. PCT/JP2010/002591.

*Primary Examiner* — Michael Tran
(74) *Attorney, Agent, or Firm* — Wenderoth, Lind & Ponack, L.L.P.

(57) ABSTRACT

Provided is a programming method for improving the retention characteristics of information in a variable resistance nonvolatile memory element. The method includes: a first writing process of applying a first voltage V1 having a first polarity to set the variable resistance nonvolatile storage element to a low resistance state LR indicating first logic information (S01); a second writing process of applying a second voltage V2 having a second polarity different from the first polarity to set the variable resistance nonvolatile storage element to a first high resistance state HR1 (S02); and a partial write process of applying a third voltage V3 having the first polarity so as to set the variable resistance layer to a second high resistance state HR2 indicating second logic information different from the first logic information (S05). Here, |V3|<|V1|, and resistance values in HR1, HR2, LR are greater in this order.

16 Claims, 11 Drawing Sheets

U.S. PATENT DOCUMENTS

| | | |
|---|---|---|
| 2009/0097300 A1 | 4/2009 | Ishihara et al. |
| 2009/0121823 A1 | 5/2009 | Kawano et al. |
| 2009/0224224 A1 | 9/2009 | Fujii et al. |
| 2009/0250678 A1 | 10/2009 | Osano et al. |
| 2009/0283736 A1 | 11/2009 | Kanzawa et al. |
| 2010/0073983 A1 | 3/2010 | Hosoi |
| 2010/0110779 A1 * | 5/2010 | Liu et al. .................. 365/163 |
| 2010/0172170 A1 | 7/2010 | Tamai et al. |

FOREIGN PATENT DOCUMENTS

| | | |
|---|---|---|
| JP | 2006-140464 | 6/2006 |
| JP | 2006-202383 | 8/2006 |
| JP | 2007-180202 | 7/2007 |
| JP | 2007-226883 | 9/2007 |
| JP | 2008-198275 | 8/2008 |
| JP | 2009-033188 | 2/2009 |
| JP | 4252110 | 4/2009 |
| JP | 4253038 | 4/2009 |
| WO | 2007/013174 | 2/2007 |
| WO | 2008/038365 | 4/2008 |
| WO | 2008/059701 | 5/2008 |
| WO | 2008/142919 | 11/2008 |

* cited by examiner

METHOD OF PROGRAMMING NONVOLATILE MEMORY ELEMENT

TECHNICAL FIELD

The present invention relates to a nonvolatile memory element, and in particular to a method of programming a variable resistance nonvolatile memory element in which a resistance value changes according to an electrical signal to be applied.

BACKGROUND ART

With the development in digital technologies in recent years, electronic devices, such as mobile information equipment and information home appliances have higher functionality. Thus, demands for a non-volatile storage element which has a greater capacity, higher writing and reading speed, and longer-life and which consumes lower power in writing have been increased.

To meet such demands, efforts in miniaturizing flash memories using existing floating gates are said to have limitations. Accordingly, attention is recently focused on a new variable resistance nonvolatile memory element including a variable resistance layer as a material of a storage unit.

The variable resistance nonvolatile memory element has a very simple structure including a variable resistance layer that is disposed between and in contact with a lower electrode and an upper electrode. A resistance state changes between a low resistance state and a high resistance state only with application, between the lower electrode and the upper electrode, of a predetermined electric pulse having a voltage equal to or higher than a threshold. Then, information is recorded in association with these different resistance states and values. Since the variable resistance nonvolatile memory element has such a simple structure and simply performs operations, it is expected that the nonvolatile memory element can further be miniaturized and the cost can be reduced. Since the resistance state sometimes changes between the low resistance state and the high resistance state in order of length of time not longer than 100 nano-seconds, the attention is further focused on the variable resistance nonvolatile memory elements in view of its higher operating speed, and various proposals have been made.

In particular in recent years, there are many proposals of variable resistance nonvolatile memory elements using metal oxides in variable resistance layers. The variable resistance nonvolatile memory elements using metal oxides can be largely divided into two types, depending on a material to be used in each variable resistance layer. One is the variable resistance nonvolatile memory elements using perovskite materials ($Pr_{(1-x)}Ca_xMnO_3$ [PCMO], $LaSrMnO_3$ [LSMO], and $GdBaCo_xO_y$ [GBCO], for example) in the variable resistance layers, as disclosed in PTL 1 and others.

The other is the variable resistance nonvolatile memory elements that are compounds comprising an only transition metal and oxygen, using binary transition metal oxides. Compared to the perovskite materials, the binary transition metal oxides have very simple composition structures. Thus, controlling the compositions when manufactured and forming the films are relatively easy. In addition, with the advantage of relatively favorable compatibility with semiconductor manufacturing processes, the variable resistance nonvolatile memory elements have intensely been studied in recent years.

For example, PTL 2 discloses a variable resistance nonvolatile memory element using, as variable resistance materials, (i) transition metal oxides of stoichiometric composition, such as nickel (Ni), niobium (Nb), titanium (Ti), zirconium (Zr), hafnium (Hf), cobalt (Co), iron (Fe), copper (Cu), and chrome (Cr), and (ii) oxides whose composition is deficient in oxygen compared to its stoichiometric composition (hereinafter referred to as oxygen-deficient oxides). Furthermore, PTL 3 discloses the variable resistance nonvolatile memory element using an oxygen-deficient tantalum (Ta) oxide as a variable resistance material. When a Ta oxide layer is denoted as $Ta_aO_x$, PTL 3 reports a resistance change phenomenon in a range satisfying $0.8 \leq x \leq 1.9$ (from 44.4% to 65.5% in terms of oxygen concentration).

Here, the oxygen-deficient oxides will be described in detail. For example, in the case of Ta, $Ta_2O_5$ is known as an oxide having a stoichiometric composition. $Ta_2O_5$ includes Ta atoms and O atoms in a 2:5 ratio, and the oxygen content percentage of $Ta_2O_5$ is 71.4 atm. %. An oxide with an oxygen content percentage lower than 71.4 atm. % is called an oxygen-deficient tantalum oxide. In this example, since $Ta_2O_5$ is an oxide of Ta, it can be represented as an oxygen-deficient Ta oxide.

CITATION LIST

Patent Literature

[PTL 1] Japanese Unexamined Patent Application Publication No. 2005-340806
[PTL 2] Japanese Unexamined Patent Application Publication No. 2006-140464
[PTL 3] International Publication WO2008/059701

SUMMARY OF INVENTION

Technical Problem

The variable resistance nonvolatile memory element has characteristics in which information is retained without being lost (volatilized) after it is electrically stored and even when the power is turned off. Thus, one of the important characteristics necessary for the variable resistance nonvolatile memory element is higher retention characteristics of information. In other words, the variable resistance nonvolatile memory element needs to have capabilities of retaining information for a certain length of period without degrading the information once written therein. Desirably, the higher capabilities of retaining the information are better. However, generally, any of the variable resistance nonvolatile memory elements cannot avoid a situation where storage information is volatilized within a finite length of time.

The variable resistance nonvolatile memory element according to the present invention is no exception where it has characteristics that information once stored is gradually volatilized as the time passes. The volatilization of information in the variable resistance nonvolatile memory element occurs as the set resistance value changes with the passage of time. In other words, the storage information is volatilized by change from the high resistance state to the low resistance state or from the low resistance state to the high resistance state. In particular, a phenomenon in which information is volatilized as the resistance value of the nonvolatile memory element that has been set to the high resistance state decreases with the passage of time easily occurs.

However, currently, the cause of such a change in the variable resistance nonvolatile memory element has not yet been determined. Moreover, no method of suppressing the change in the resistance state of the variable resistance nonvolatile memory element in which the storage information is being held is disclosed.

In view of the problems, the present invention has an object of suggesting a method of writing information for improving the retention characteristics of information stored in the variable resistance nonvolatile memory element.

Solution to Problem

The method of programming a variable resistance nonvolatile memory element according to an aspect of the present invention is a method of programming a nonvolatile memory element including a first electrode, a second electrode, and a variable resistance layer which (i) is disposed between and in contact with the first electrode and the second electrode, (ii) has a resistance state that reversibly changes based on electrical signals having different polarities and provided between the first electrode and the second electrode, and (iii) includes an oxygen-deficient transition metal oxide layer, and the method includes: a first writing process of applying a first voltage having a first polarity between the first electrode and the second electrode so as to set the variable resistance layer to a low resistance state corresponding to first logical information; a second writing process of applying a second voltage having a second polarity between the first electrode and the second electrode so as to set the variable resistance layer to a first high resistance state in which a resistance value is higher than a resistance value in the low resistance state, the second polarity being different from the first polarity; and a partial write process of applying a third voltage having the first polarity between the first electrode and the second electrode after the second writing process so as to set the variable resistance layer to a second high resistance state in which a resistance value is higher than the resistance value in the low resistance state and is lower than the resistance value in the first high resistance state, the third voltage having an absolute value lower than an absolute value of the first voltage, and the second high resistance state corresponding to second logical information different from the first logical information.

Furthermore, in the partial write process, the nonvolatile memory element may be connected in series with a load resistor to form a series circuit, and a voltage having the first polarity may be applied to the series circuit, so that a divided voltage equivalent to the third voltage is applied between the first electrode and the second electrode of the nonvolatile memory element.

Furthermore, in the partial write process, the nonvolatile memory element may be connected in series with a channel of a transistor as the load resistor to form the series circuit, and the voltage having the first polarity may be applied to the series circuit in a state where a channel resistance of the transistor is set to a predetermined resistance value with application of a predetermined voltage to a gate of the transistor, so that the divided voltage equivalent to the third voltage is applied between the first electrode and the second electrode of the nonvolatile memory element.

Furthermore, the nonvolatile storage device according to an aspect of the present invention is a nonvolatile storage device including: a nonvolatile memory element including a first electrode, a second electrode, and a variable resistance layer which (i) is disposed between and in contact with the first electrode and the second electrode, (ii) has a resistance state that reversibly changes based on electrical signals having different polarities and provided between the first electrode and the second electrode, and (iii) includes an oxygen-deficient transition metal oxide layer; and a programming circuit, wherein the programming circuit performs: a first writing process of applying a first voltage having a first polarity between the first electrode and the second electrode so as to set the variable resistance layer to a low resistance state corresponding to first logical information; a second writing process of applying a second voltage having a second polarity between the first electrode and the second electrode so as to set the variable resistance layer to a first high resistance state in which a resistance value is higher than a resistance value in the low resistance state, the second polarity being different from the first polarity; and a partial write process of applying a third voltage having the first polarity between the first electrode and the second electrode after the second writing process so as to set the variable resistance layer to a second high resistance state in which a resistance value is higher than the resistance value in the low resistance state and is lower than the resistance value in the first high resistance state, the third voltage having an absolute value lower than an absolute value of the first voltage, and the second high resistance state corresponding to second logical information different from the first logical information.

Furthermore, the first electrode and the second electrode may be electrically connected to a first metal line and a second metal line, respectively, and the programming circuit may include: a first power source that applies a voltage between the first metal line and the second metal line, the voltage being used for applying the first voltage between the first electrode and the second electrode in the first writing process; a second power source that applies a voltage between the first metal line and the second metal line, the voltage being used for applying the second voltage between the first electrode and the second electrode in the second writing process; and a third power source that applies a voltage between the first metal line and the second metal line, the voltage being used for applying the third voltage between the first electrode and the second electrode in the partial write process.

The third power source may include a load resistor element connected in series with the nonvolatile memory element. The load resistor element may be a transistor connected in series with the nonvolatile memory element.

The variable resistance layer may include at least two oxygen-deficient transition metal oxide layers having different oxygen concentrations, and one of the at least two oxygen-deficient transition metal oxide layers having a higher oxygen concentration may be in contact with one of the first electrode and the second electrode.

A transition metal included in the oxygen-deficient transition metal oxide layer may be tantalum.

The programming circuit may perform the partial write process every after the second writing process.

Furthermore, the programming circuit may perform the partial write process before shutting down power supplied to the nonvolatile storage device, before transition to a standby mode, or before shutting down the power supplied to the nonvolatile storage device and before transition to the standby mode.

Furthermore, the nonvolatile storage device may include a plurality of nonvolatile memory elements including the nonvolatile memory element, and the programming circuit may detect one of the nonvolatile memory elements that is in the first high resistance state before shutting down the power, and may perform the partial write process on the detected nonvolatile memory element.

Furthermore, the programming circuit may detect the one of the nonvolatile memory elements in the first high resistance state, by defining a threshold between the resistance value in the first high resistance state and the resistance value in the second high resistance state and comparing the threshold with a resistance value read from the one of the nonvolatile memory elements.

Furthermore, the programming circuit may perform the partial write process when the nonvolatile storage device is in an idle state.

Advantageous Effects of Invention

The programming method of a nonvolatile memory element and a nonvolatile storage device according to the present invention improve the retention capabilities of written information.

DESCRIPTION OF EMBODIMENTS

Embodiment 1

A method of programming a nonvolatile memory element according to Embodiment 1 in the present invention will be described with reference to the drawings.

[A Structure of the Nonvolatile Memory Element]

Figure 1:
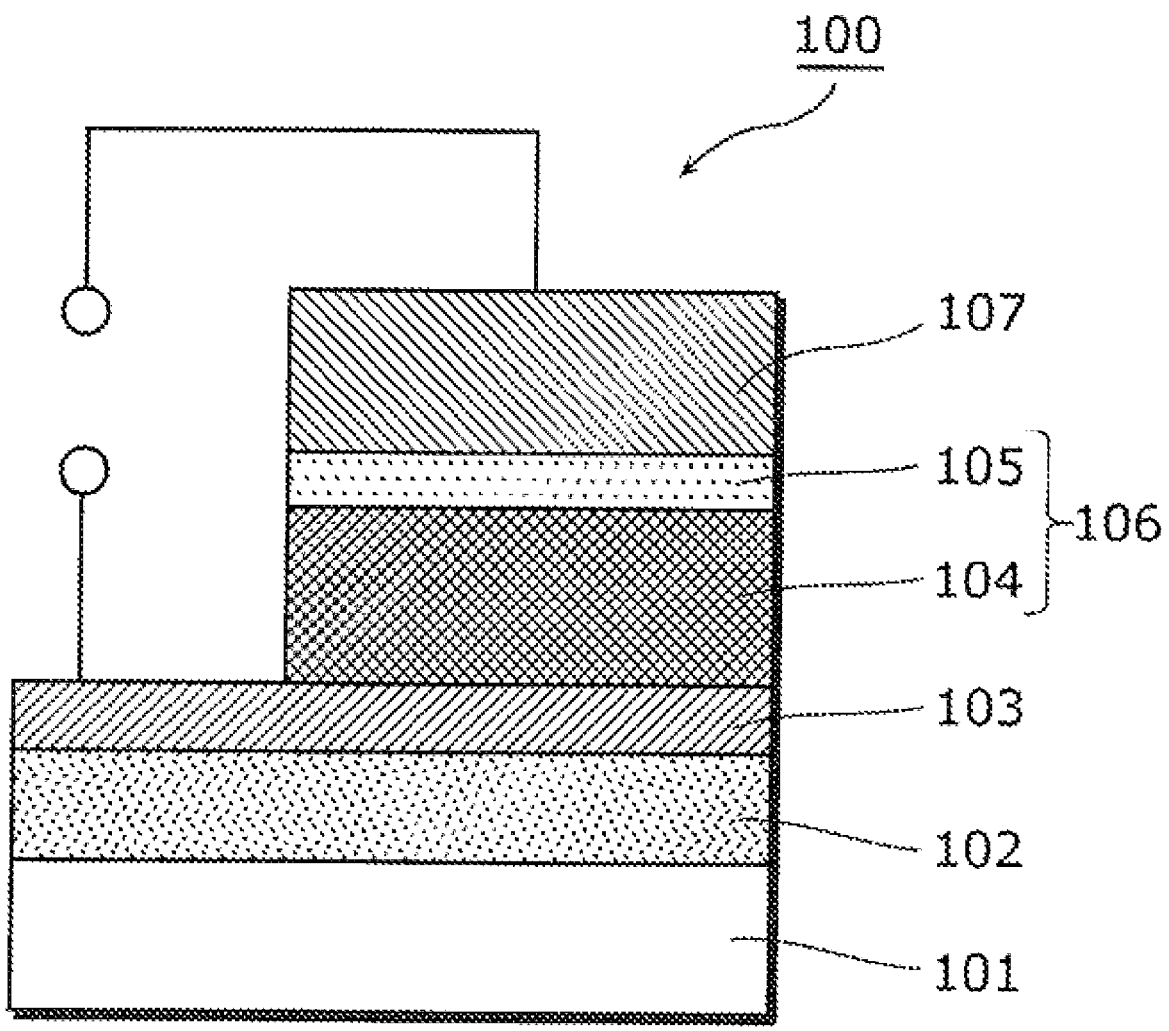
FIG. 1 illustrates a cross-sectional view of a structure of a nonvolatile memory element according to Embodiment 1 in the present invention.

FIG. 1 illustrates a cross-sectional view of a structure example of a nonvolatile memory element to be programmed in a programming method, according to Embodiment 1 in the present invention.

As illustrated in FIG. 1, a nonvolatile memory element 100 according to Embodiment 1 includes a substrate 101, an oxide layer 102 formed on the substrate 101, a lower electrode 103 formed on the oxide layer 102, a variable resistance layer 106 including a first oxygen-deficient transition metal oxide layer 104 and a second oxygen-deficient transition metal oxide layer 105 having an oxygen concentration higher than that of the first oxygen-deficient transition metal oxide layer 104, and an upper electrode 107. When the nonvolatile memory element 100 is programmed, the voltage satisfying a predetermined condition is applied between the lower electrode 103 and the upper electrode 107 from an external power supply.

Embodiment 1 describes an example in which a tantalum oxide layer comprising tantalum as a transition metal oxide is used as a transition metal oxide layer. Hereinafter, the tantalum oxide layer is abbreviated as a Ta oxide layer.

[Manufacturing Method of the Nonvolatile Memory Element]

Next, a method of manufacturing the nonvolatile memory element 100 according to Embodiment 1 will be described.

First, thermal oxidation produced the oxide layer 102 having a thickness of 200 nm on the substrate 101 that is a single-crystal silicon substrate. Then, tantalum nitride (TaN) having a thickness of 40 nm was deposited on the oxide layer 102 as the lower electrode 103 by sputtering.

Next, the first oxygen-deficient Ta oxide layer 104 was deposited with a thickness of 50 nm on the lower electrode 103. Here, the first oxygen-deficient Ta oxide was formed by sputtering a Ta target in argon (Ar) gas and oxygen ($O_2$) gas. The specific sputtering condition when the oxygen-deficient Ta oxide is deposited was as follows: the vacuum (back pressure) in the sputtering apparatus was approximately $7 \times 10^{-4}$ Pa before sputtering; power was 250 W when sputtering; the total gas pressure of the argon gas and the oxygen gas was 3.3 Pa; the partial pressure ratio of the oxygen gas to the total gas was 3.8%; the preset temperature of the substrate was 30 degrees Celsius; and the time period for film formation was 7 minutes. With the condition, the first oxygen-deficient Ta oxide layer 104 having an oxygen content percentage of approximately 58 atm. % was deposited with the thickness of 50 nm. Here, the oxygen content percentage of the oxygen-deficient Ta oxide is approximately 58 atm. %, and x is 1.38 when the Ta oxide is denoted as $TaO_x$.

Next, the plasma oxidizer oxidized a surface of the first oxygen-deficient Ta oxide layer 104 to form the second oxygen-deficient Ta oxide layer 105 having a thickness of approximately 8 nm (although the second oxygen-deficient Ta oxide layer 105 was provided to stabilize the initial operation of the nonvolatile memory element, it may be formed with application of a voltage after manufacturing the nonvolatile memory element. Thus, the second oxygen-deficient Ta oxide layer 105 need not be formed when the nonvolatile memory element is formed). Here, the oxygen content percentage of the second oxygen-deficient Ta oxide layer 105 was 71 atm. %, and y was equal to 2.47 when the Ta oxide is denoted as $TaO_y$. In other words, oxygen was slightly deficient in $TaO_y$ than in $TaO_{2.5}$ ($Ta_2O_5$) having a stoichiometric composition, and $TaO_y$ was in a resistance state higher than that of the first oxygen-deficient Ta oxide layer 104.

Then, a platinum (Pt) thin layer was formed on the second oxygen-deficient Ta oxide layer 105 as the upper electrode 107 by sputtering. The Pt thin layer was deposited with a thickness of 80 nm in Embodiment 1.

With the processes, the nonvolatile memory element 100 was manufactured in which the variable resistance layer 106 comprising an oxygen-deficient Ta oxide was sandwiched between the lower electrode 103 and the upper electrode 107.

[Setting a Resistance Value]

The pulse of voltage was applied between the lower electrode 103 and the upper electrode 107 of the nonvolatile memory element 100 manufactured as described above to cause a resistance change, and the resistance value was measured.

In the measurement, the nonvolatile memory element 100 including the upper electrode 107 having a size of 0.5 μm×0.5 μm was used. In order to cause the resistance change, electrical pulses having a predetermined voltage value and a pulse width of 100 ns were applied between the lower electrode 103 and the upper electrode 107. Furthermore, after the application of the electrical pulses for the resistance change, the resistance value of the nonvolatile memory element 100 was calculated by measuring the current flowing with the application of a voltage as small as 50 mV that does not cause the resistance change.

The positive and negative polarities of the voltage between the lower electrode 103 and the upper electrode 107 are represented with respect to the lower electrode 103. In other words, when the voltage of the upper electrode 107 is higher than that of the lower electrode 103, the voltage is represented by the positive polarity. Conversely, when the voltage of the upper electrode 107 is lower than that of the lower electrode 103, the voltage is represented by the negative polarity.

Figure 2:
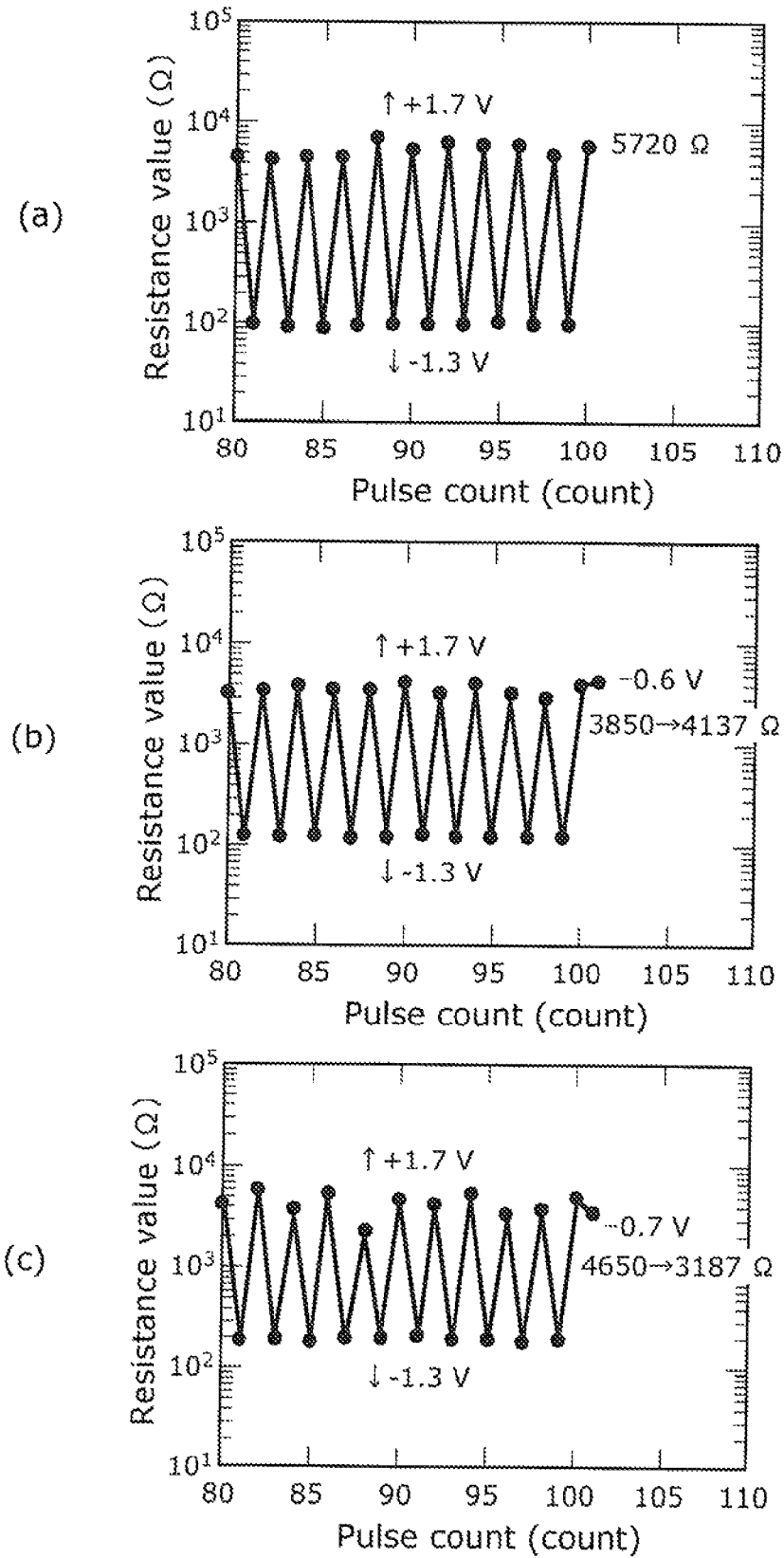
FIG. 2 (a) to (c) illustrates relationships between resistance values of a nonvolatile memory element and a count of pulses to be applied thereto according to Embodiment 1 in the present invention.

In Embodiment 1, three nonvolatile memory elements having almost the same structure were prepared. The three nonvolatile memory elements are named an element A, an element B, and an element C. First, in order to condition each of the elements, the electrical pulses of +1.7 V and −1.3 V were alternately applied between the lower electrode 103 and the upper electrode 107 50 times each, 100 times in total. Then, when the electrical pulse of +1.7 V was applied, the resistance value between the lower electrode 103 and the upper electrode 107 was changed to a high resistance state. In contrast, when the electrical pulse of −1.3 V was applied, the resistance value between the lower electrode 103 and the upper electrode 107 was changed to a low resistance state. FIG. 2 (a) to (c) illustrates theses changes in each resistance state (resistance changes with the application of the electrical pulses only after 80 times are illustrated in order to facilitate the understanding of the final application of the voltage).

As illustrated in FIG. 2 (a), in the element A, the resistance values between the lower electrode 103 and the upper electrode 107 with the application of +1.7 V became approximately 5 kΩ, the resistance values with the application of −1.3 V became approximately 100Ω, and the resistance value with the 100th application of +1.7 V became 5720Ω. As illustrated in FIG. 2 (b), in the element B, the resistance values with the application of +1.7 V became approximately 4 kΩ, the resistance values with the application of −1.3 V became approximately 100Ω, and the resistance value with the 100th application of the electrical pulses became 3850Ω. As illustrated in FIG. 2 (c), in the element C, the resistance values with the application of +1.7 V became approximately 5 kΩ, the resistance values with the application of −1.3 V became approximately 200Ω, and the resistance value with the 100th application of the electrical pulses became 4650Ω. The differences between these resistance values are due to simple variations in the nonvolatile memory elements.

As described above, after the nonvolatile memory elements A to C were conditioned with each 100 times of the operations, different electrical pulses were applied to the elements B and C. As illustrated in FIG. 2 (b), −0.6 V was applied to the element B with the 101st application of the pulse. Here, although the resistance value slightly increased from 3850Ω to 4137Ω, basically there was no change in the state of the element B. On the other hand, as illustrated in FIG. 2 (c), −0.7 V was applied to the element C with the 101st application of the pulse. Then, the resistance value decreased from 4650Ω to 3187Ω. Since the nonvolatile memory elements used in Embodiment 1 have characteristics in which the state is changed to the low resistance state with the application of a negative voltage, it is probable that the state of the element C was slightly changed to the low resistance state.

Hereinafter, the operation of applying a voltage having a reverse polarity subsequently after a voltage having a certain polarity is applied to set a resistance value is referred to as a partial write process. In the aforementioned example, the states of the elements B and C were changed to the high resistance state with the application of +1.7 V voltage and then, the negative smaller voltages (−0.6 V and −0.7 V) were applied. The application of the negative voltage is the partial write process.

More specifically in the aforementioned example, whereas the operation of setting the states of the elements A to C to the low resistance state of approximately 100Ω with the application of the electrical pulse of −1.3 V (first voltage) is an example of the first writing process according to the present invention, the operation of setting the states of the elements A to C to the first high resistance state of approximately several thousand Ω with the application of the electrical pulse of +1.7 V (second voltage) is an example of the second writing process according to the present invention.

Furthermore, the operation of setting the state of the element C to the second high resistance state of 3187Ω with the application of the electrical pulse of −0.7 V (third voltage) after the second writing process is an example of the partial write process according to the present invention. The second high resistance state is higher in resistance value than the low resistance state, and is lower in resistance value than the first high resistance state.

[Retention Characteristics of Resistance Values]

The retention characteristics of resistance values of the elements A to C prepared as above were evaluated. Regarding the characteristics, the elements A to C have almost no degradation in the resistance values thereof, approximately at a room temperature for over 10 years. Then, the nonvolatile memory elements were held in a thermostatic chamber at 210 degrees Celsius to accelerate the degradation, and the retention characteristics of resistance values were evaluated. The resistance values were measured at the room temperature by retrieving the nonvolatile memory elements from the thermostatic chamber.

In other words, the retention characteristics were evaluated with the repetition of retaining the elements in the thermostatic chamber and measurement of the elements at the room temperature. Furthermore, what was performed was not additional writing in the nonvolatile memory elements (that is, maintaining a state with the set resistance value) but only reading from the nonvolatile memory elements using a low voltage at which no resistance change occurs.

Figure 3:
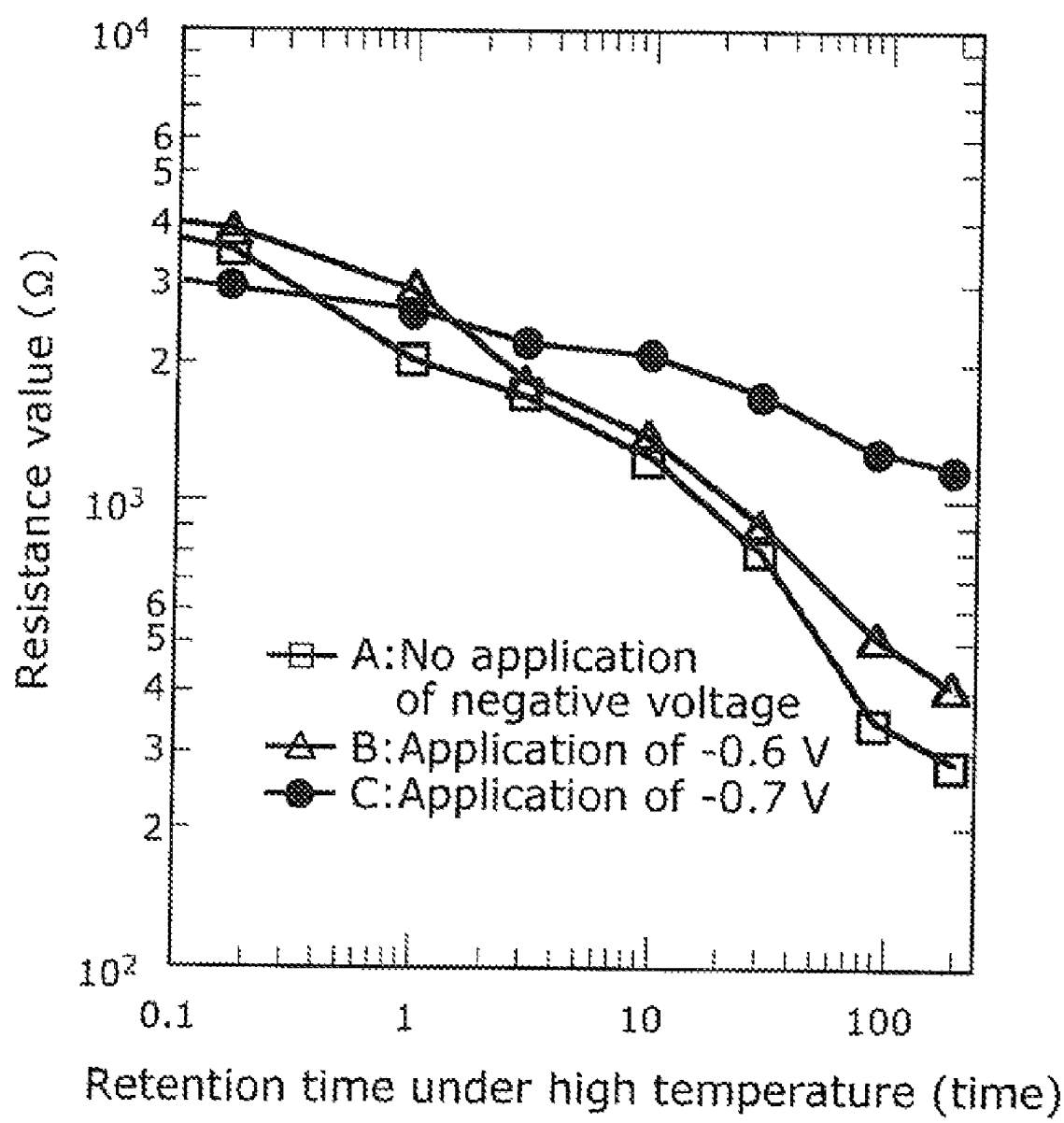
FIG. 3 illustrates the retention characteristics of resistance values of a nonvolatile memory element at 210 degrees Celsius according to Embodiment 1 in the present invention.

FIG. 3 illustrates the result of the evaluation. In FIG. 3, the horizontal axis shows the retention time in the thermostatic chamber (cumulative time), and the vertical axis shows the resistance values. The values are logarithmically plotted.

As shown in FIG. 3, although the resistance value of the element A was approximately 4000Ω with the retention time of 10 minutes (0.17 hour) at the thermostatic chamber, it decreased to approximately 300Ω that is almost one tenth of the former value after 100 hours. Furthermore, the element B that was partially written with the electrical pulse of −0.6 V had almost the same change as that of the element A. On the other hand, FIG. 3 shows that although the element C that was partially written with the electrical pulse of −0.7 V had the resistance value of approximately 3000Ω which is lower than those of the elements A and B, with the retention time of 10 minutes at the thermostatic chamber, there was a tendency that the resistance value hardly decreases. It is noteworthy that with the retention time of approximately 1 hour at the thermostatic chamber, the tendency of the resistance values was reversed between the element C and the elements A and B, and the resistance value of the element C became higher than those of the elements A and B. The element C kept the resistance state higher than those of the elements A and B, with the resistance value of approximately 1 kΩ after 100 hours, which is almost one third of the initial resistance value. In other words, the result in FIG. 3 shows that the retention characteristics of the resistance values (that is, storage information) of the element C that were partially written with the application of a voltage of −0.7 V are significantly superior to those of the elements A and B.

Here looking back on the resistance change when the resistance value of the nonvolatile memory element C was set, the element C partially written with the application of −0.7 V had the slight decrease in the resistance values when the voltage of −0.7 V was applied. In other words, the resistance state probably changed in the element C. In contrast, the nonvolatile memory element B partially written with the application of −0.6 V had almost no change in the resistance values. Thus, the resistance state did not probably change in the element B. In other words, probably, the element B was almost in the same resistance state as that of the element A.

These facts and the result in FIG. 3 lead to the following inference. In other words, after the second writing process for setting a variable resistance nonvolatile memory element to the first high resistance state, a partial write process is performed by continuously applying, to the variable resistance nonvolatile memory element, a voltage (i) having a polarity reverse to the polarity of the voltage applied in the second writing process for setting the variable resistance nonvolatile memory element to the first high resistance state and (ii) that is small enough to cause a slight change in the resistance state of the nonvolatile memory element to change the first high resistance state to the second high resistance state. With the partial write process, the retention characteristics of the resistance values of the variable resistance nonvolatile memory element are probably improved. Furthermore, the nonvolatile memory element that can store binary information with the favorable retention characteristics can be formed by associating information with the second high resistance state and with the low resistance state.

[Mechanism for Improving the Data Retention Characteristics by Partial Writing]

Next, why the data retention characteristics is improved by setting the nonvolatile memory element to the second high resistance state by the partial writing will be described. Since the mechanism for improving the data retention characteristics does not yet reach a definitive conclusion, the following description is limited to two possibilities.

Figure 4:
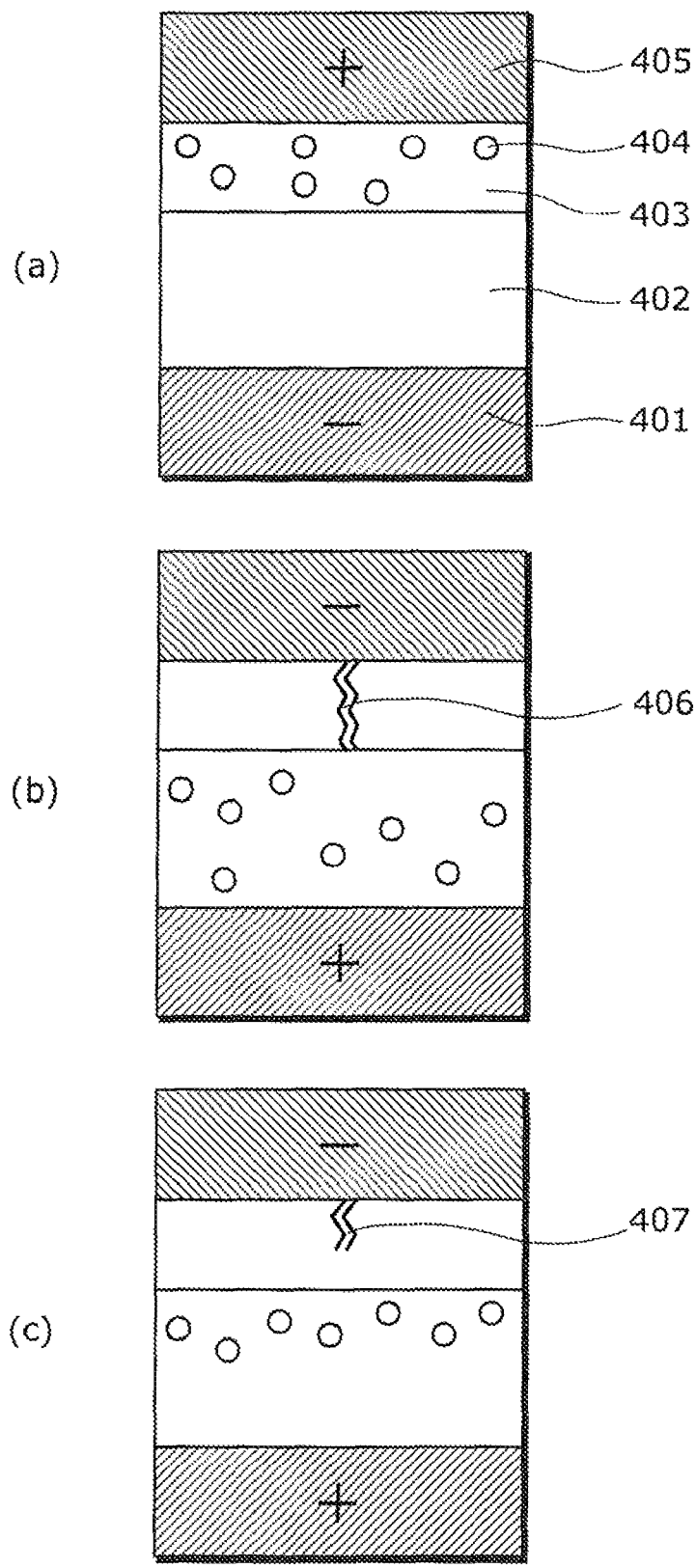
FIG. 4 (a) to (c) is a hypothetical diagram illustrating states inside a nonvolatile memory element when electric pulses are applied thereto according to Embodiment 1 in the present invention.

First, a difference between the first high resistance state and the low resistance state of the variable resistance nonvolatile memory element described in Embodiment 1 will be described. FIG. 4 (a) illustrates a cross-sectional schematic diagram of a nonvolatile memory element in the first high resistance state, and FIG. 4 (b) illustrates a cross-sectional schematic diagram of the nonvolatile memory element in the low resistance state.

First, the first high resistance state is probably a state where a second oxygen-deficient Ta oxide layer 403 does not include a conduction path that connects an upper electrode 405 and a first oxygen-deficient Ta oxide layer 402 as illustrated in FIG. 4 (a). The second oxygen-deficient Ta oxide layer 403 has a composition closer to that of $Ta_2O_5$ that is an insulator, and has originally the characteristics of higher resistance. Thus, the resistance between the lower electrode 401 and the upper electrode 405 becomes higher.

In contrast, the low resistance state is probably a state where the second oxygen-deficient Ta oxide layer 403 includes a minute conduction path (minute conduction channel) 406 causing the upper electrode 405 and the first oxygen-deficient Ta oxide layer 402 to be partially short-circuited as illustrated in FIG. 4 (b). Thus, the resistance between the lower electrode 401 and the upper electrode 405 becomes lower. Probably, the minute conduction path 406 is of oxygen vacancy where oxygen is removed, or is a metal portion changed by reduction.

The reason why the change occurs between the first high resistance state as in FIG. 4 (a) and the low resistance state as in FIG. 4 (b) with the application of electrical pulses is probably due to migration of oxygen ions 404.

In other words, a negative voltage is applied to the upper electrode 405 with respect to the lower electrode 401 as illustrated in FIG. 4 (b) in the case of change from the first high resistance state to the low resistance state. Then, an electric field produced by the application causes the oxygen ions 404 to be extracted from the second oxygen-deficient Ta oxide layer 403 to the first oxygen-deficient Ta oxide layer 402, and the minute conduction path 406 is formed as a result of the extraction.

Conversely, a positive voltage is applied to the upper electrode 405 with respect to the lower electrode 401 as illustrated in FIG. 4 (a) in the case of change from the low resistance state to the first high resistance state. Here, the electric field causes the oxygen ions 404 to be implanted from the first oxygen-deficient Ta oxide layer 402 to the second oxygen-deficient Ta oxide layer 403, and a part of the oxygen ions 404 oxidizes the minute conduction path 406. Then, the oxidized minute conduction path 406 disappears and the state is changed to the high resistance state.

The size of the minute conduction path 406 is probably not large (so small that the cross-section of the minute conduction path 406 cannot be observed even by a transmission electron microscope). Thus, the oxygen ions to be consumed by oxidation are probably not large in number. In other words, the second oxygen-deficient Ta oxide layer 403 probably contains the excessive amount of oxygen ions implanted in the first high resistance state.

Based on the mechanism of the resistance change, the mechanism for improving the retention characteristics of resistance values by the partial writing according to the present invention has been examined.

First, with the attention focused on the presence of oxygen ions, a state of the second oxygen-deficient Ta oxide layer 403 will be discussed hereinafter. As described above, the second oxygen-deficient Ta oxide layer 403 probably contains the excessive amount of oxygen ions 404 implanted in the first high resistance state of FIG. 4 (a). In this case, bond in $TaO_x$ included in the second oxygen-deficient Ta oxide layer is probably distorted by the excessively implanted oxygen ions 404. It is probable that the crystal in such a state is thermally unstable in general. Thus, a defect is easily formed in the second oxygen-deficient Ta oxide layer 403 with the heat. The defect results in the minute conduction path 406.

However, when the positive voltage is applied to the lower electrode 401, the negative voltage is applied to the upper electrode 405, and the partial write process is performed, as illustrated in FIG. 4 (c), the excessive amount of oxygen ions is extracted to the first oxygen-deficient Ta oxide layer 402. Thereby, the first oxygen-deficient Ta oxide layer 402 is set to the second high resistance state (here, a partially imperfect minute conduction path 407 is formed so that the resistance value is lowered). Then, TaO$_x$ included in the second oxygen-deficient Ta oxide layer 403 is stabilized, and the thermal tolerance becomes higher. With the addition of heat, the state probably makes it difficult to form a minute conduction path.

With the reasoning above, the data retention characteristics will be improved in the state illustrated in FIG. 4 (c) that is partially written up to the second high resistance state rather than the state illustrated in FIG. 4 (a) that is simply set to the first high resistance state.

The other possibility is the effect of the concentration gradient of oxygen ions. In FIG. 4 (a) in the first high resistance state, the oxygen ion concentration in the second oxygen-deficient Ta oxide layer 403 is higher, and the oxygen concentration in the first oxygen-deficient Ta oxide layer 402 is lower. Under such a state, when the sample was given heat, the oxygen ions easily diffused from the second oxygen-deficient Ta oxide layer 403 to the first oxygen-deficient Ta oxide layer 402 with the concentration gradient of oxygen ions. Thereby, the minute conduction path 406 was easily formed with the desorption of the oxygen ions.

On the other hand, in the second high resistance state in FIG. 4 (c) in which the partial write process was performed, the oxygen ion concentration in the second oxygen-deficient Ta oxide layer 403 is lower and the oxygen concentration in the first oxygen-deficient Ta oxide layer 402 is higher than that of the first high resistance state in FIG. 4 (a). Under such circumstances, the diffusion of the oxygen ions hardly occurs, and obviously, difficulties lie in the formation of the minute conduction path 406. Thus, the data retention characteristics in the second high resistance state in FIG. 4 (c) in which the partial write process was performed are favorable.

Although Embodiment 1 describes the example of the nonvolatile memory element in which an oxygen-deficient Ta oxide is used in a variable resistance layer, the mechanism of the partial writing is probably applicable to a nonvolatile memory element in which an oxygen-deficient oxide other than Ta is used in the variable resistance layer and which includes at least two oxygen-deficient oxide layers having different oxygen concentrations.

In other words, the nonvolatile memory element in which an oxygen-deficient oxide other than Ta is used in the variable resistance layer and which has a resistance change with the application of electrical pulses having different polarities to an electrode probably enjoys the advantage of the partial writing described for the mechanism.

The oxygen-deficient oxide other than Ta is, for example, a hafnium oxide (Hf oxide) and a zirconium oxide (Zr oxide). The Hf oxides include a first oxygen-deficient Hf oxide (HfO$_x$) and a second oxygen-deficient Hf oxide (HfO$_y$), where the composition is represented by $0.9 \leq x \leq 1.6$ and $1.8 < y < 2.0$. The thickness of the second oxygen-deficient Hf oxide layer is desirably 3 to 4 nm. Furthermore, the Zr oxides include a first oxygen-deficient Zr oxide (ZrOx) and a second oxygen-deficient Zr oxide (ZrOy), where the composition is represented by $0.9 \leq x \leq 1.4$ and $1.9 < y < 2.0$. The thickness of the second oxygen-deficient Zr oxide layer is desirably 1 to 5 nm.

Furthermore, transition metal oxide layers may be not only double layers but also at least triple layers. As long as an oxygen-deficient transition metal oxide layer having the highest oxygen concentration is connected to an upper electrode or a lower electrode, the same advantage as that of Embodiment 1 can be expected.

Comparison Example

With the mechanism, the state in FIG. 4 (c) may be created by adjusting the magnitude of the voltage to be applied in the high resistance state without partial writing according to the present invention. In other words, in the above example, the positive voltage smaller than +1.7 V has only to be applied in the high resistance state so that the nonvolatile memory element is set directly from the low resistance state to the second high resistance state equivalent to a state obtained by performing the partial write process. However, another problem occurred which worsens the reproducibility of the high resistance state due to an insufficient writing operation for the high resistance state created in the aforementioned method.

Figure 5:
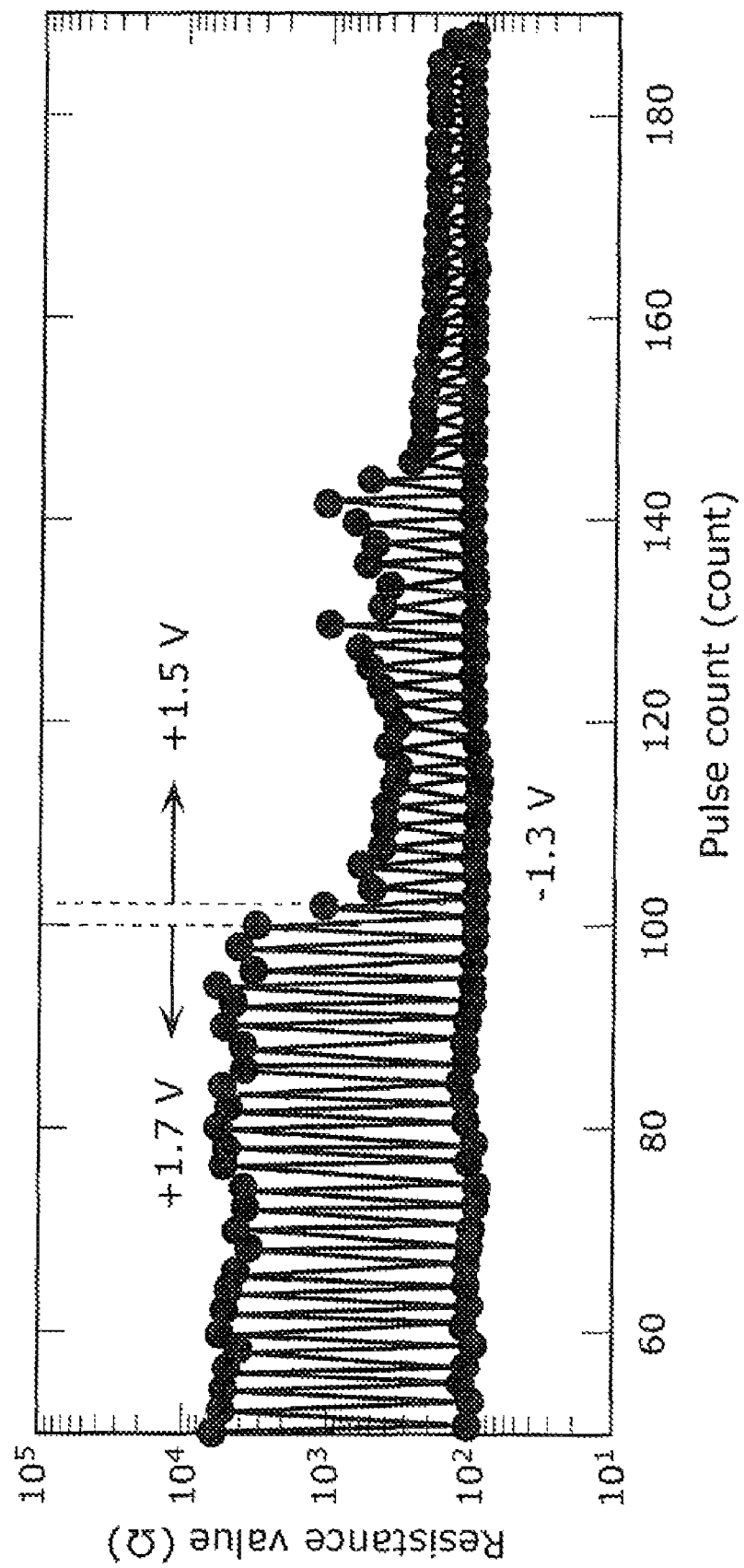
FIG. 5 illustrates relationships between resistance values of a nonvolatile memory element and a count of pulses to be applied thereto according to Embodiment 1 in the present invention.

As a comparison example, an experiment has been conducted which changes a resistance state of a nonvolatile memory element equivalent to the elements A to C by reducing, in midstream, the voltage applied in the high resistance state. FIG. 5 illustrates the result of the experiment, that is, the resistance change with alternate application of electrical pulses of +1.7 V and −1.3 V up to 100 times as in the example of FIG. 2. During the time period, the resistance values were relatively stable in the range between approximately 4 to 5 kΩ and approximately 100Ω with the application of each of the voltages.

Then, after the state of the nonvolatile memory element was changed to the low resistance state with the 101st application of the voltage of −1.3 V, +1.5 V that is a lower voltage than +1.7 V by 0.2 V was applied as a high resistance voltage with the 102nd application of the pulse. Then, the resistance value in the high resistance state became smaller, resulting in a state similar to the state where the partial write process was performed as in FIG. 2 (c) (that is, the resistance value is higher that that of the low resistance state and lower than that of the first high resistance state). The inside of the nonvolatile memory element is probably in a state as illustrated in FIG. 4 (c).

However, after the 102nd application of the pulse, with the continuous application of voltages of +1.5 V and −1.3 V, the values in the high resistance state were not stable as illustrated in FIG. 5. Finally, the resistance state was not changed at all. This is probably because the voltage required for the high resistance state was so low that the state was not changed to the high resistance state. The results show that it is difficult to store information with the creation of the state as in FIG. 4 (b) by adjusting the voltage for the high resistance state. Thus, it is probably necessary to apply a higher voltage to the nonvolatile memory element to change the state to the first high resistance state (the second writing process), and partially write to change the state to the second high resistance state (partial write process).

Although in the variable resistance nonvolatile memory element using a Ta oxide described in Embodiment 1, the first oxygen-deficient Ta oxide layer 104 has the oxygen content percentage of 58 atm. % and has the thickness of approximately 50 nm, the variable resistance nonvolatile memory element is limited to such. Furthermore, the oxygen content percentage and the thickness of the second oxygen-deficient Ta oxide layer 105 are not limited to the aforementioned values. Furthermore, although TaN and Pt are used as materials of electrodes in Embodiment 1, the materials are not limited to them, and gold (Au), iridium (Ir), palladium (Pd), silver (Ag), copper (Cu), tungsten (W), nickel (Ni), and others may be used.

Furthermore, the second oxygen-deficient Ta oxide layer 105 does not always have to be included in the formation of a nonvolatile memory element, and it may be electrically formed with the application of a higher voltage between the lower electrode 103 and the upper electrode 107 (operation referred to as forming) after the formation of the nonvolatile memory element.

Furthermore, in Embodiment 1, the first voltage to be applied to the nonvolatile memory element in the first writing process for changing the state thereof to the low resistance state was −1.3V, the second voltage to be applied to the nonvolatile memory element in the second writing process for changing the state thereof to the first high resistance state was +1.7V, and the voltage to be applied to the nonvolatile memory element in the partial write process for changing the state thereof to the second high resistance state was −0.7 V. The voltages to be applied are not limited to these. In other words, the voltage values are determined depending on a structure of a nonvolatile memory element.

Furthermore, although the partial write process was performed after the application of the total 100 times of electrical pulses, the processes were to evaluate the nonvolatile memory element by conditioning the initial state. When an actual nonvolatile memory element is used, there is no need to perform 100 times of the first and to second writing processes for sure, prior to one-time of a partial write process.

Furthermore, a polarity of a voltage to be applied is not limited to the described polarities. In other words, a structure in which the second oxygen-deficient Ta oxide layer 105 is disposed between the lower electrode 103 and the first oxygen-deficient Ta oxide layer 104 in the nonvolatile memory element of FIG. 1 produces the resistance change with the application of the voltage and the voltage having the reverse polarity described in Embodiment 1. In other words, the nonvolatile memory element having such a structure changes the state to the high resistance state with the application of a negative voltage, and to the low resistance state with the application of a positive voltage.

Here, the state is set to the first high resistance state with the application of a negative voltage to the nonvolatile memory element, and subsequently to the second high resistance state by partial write with the application of a positive voltage. Thus, information can be stored using the second high resistance state set in such a manner and the low resistance state set with the application of a positive voltage.

Embodiment 2

Embodiment 1 describes that a positive voltage is applied to a nonvolatile memory element to change the state to the first high resistance state and then a negative voltage having a magnitude adjusted to an optimal state is directly applied to the nonvolatile memory element to perform the partial write process. Embodiment 2 describes a method of applying a voltage by connecting a nonvolatile memory element to a load resistor when the partial write process is performed. The nonvolatile memory element to be described hereinafter is assumed to be manufactured in the same manner as in Embodiment 1.

[Setting Resistance Values]

Figure 6:
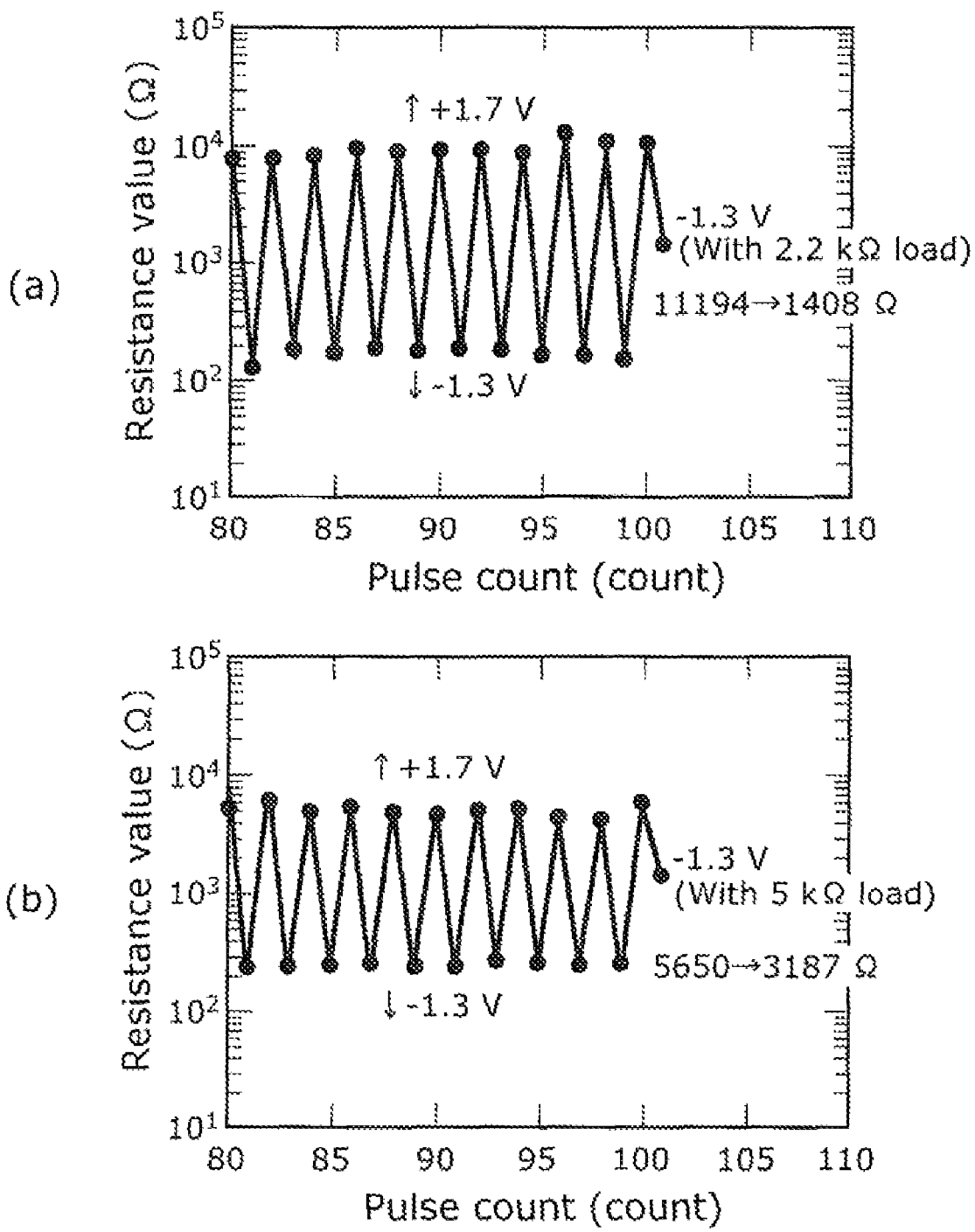
FIGS. 6 (a) and (b) illustrates relationships between resistance values of a nonvolatile memory element and a count of pulses to be applied thereto according to Embodiment 2 in the present invention.

Two nonvolatile memory elements were prepared in Embodiment 2. These nonvolatile memory elements are referred to as elements D and E. As in Embodiment 1, in order to condition an initial state of the elements, the second writing process of applying the electrical pulse of +1.7 V (second voltage) and the first writing process of applying the electrical pulse of −1.3 V (first voltage) were alternately performed 50 times each, 100 times in total. The electrical pulses were directly applied to the nonvolatile memory elements. FIGS. 6 (a) and (b) illustrates states of the resistance change (state before 80 times is omitted).

FIG. 6 (a) illustrates the states of the resistance change in the element D. With the application of +1.7 V, the resistance values became approximately 101 kΩ, and with the application of −1.3 V, the resistance values became approximately 100Ω. In contrast, FIG. 6 (b) illustrates resistance values of the element E. With the application of +1.7 V, the resistance values became approximately 5 kΩ, and with the application of −1.3 V, the resistance values became approximately 200Ω. The difference in resistance value between the elements D and E reflect variations in the nonvolatile memory elements, and the elements D and E have no difference in the basic characteristics.

Then, a load resistor having a resistance of 2.2 kΩ was connected in series with a nonvolatile memory element 701 at the 101st application of the pulse, and a voltage of −1.3 V (voltage enough to change the state to the low resistance state without providing a load resistor) was applied to the element D to perform the partial write process. Then, the resistance value decreases from 11194Ω to 1408Ω (indicating the resistance value at the 100th application of the pulse and the resistance value at the 101st application of the pulse in FIG. 6 (a) that are resistance values of the element D from each of which the resistance value of 2.2 kΩ of the load resistor is subtracted). Furthermore, a load resistor having a resistance of 5 kΩ was connected in series with the element E, and a voltage of −1.3 V was applied to the element E to perform the partial write process. Here, the resistance value decreases from 5650Ω to 3187Ω (these values are also resistance values from each of which the resistance value of the load resistor is subtracted).

The operations to set the resistance values will be described in detail with reference to FIG. 7. The operations are equivalent to alternately applying the electrical pulses of +1.7 V and −1.3 V to the nonvolatile memory element 701 directly using terminals 705 and 706 up to 100 times, and applying the electrical pulse of −1.3 V to the nonvolatile memory element 701 and a load resistor 702 using terminals 703 and 704 for the 101st time. The resistance values were measured by applying a voltage of 50 mV between the terminals 705 and 706.

[Retention Characteristics of Resistance Values]

The data retention characteristics of the elements E and D to which the resistance values are set in such a method were evaluated.

The evaluation method is the same as that described in Embodiment 1, where the nonvolatile memory elements were held in a thermostatic chamber at 210 degrees Celsius to accelerate the degradation of the data retention characteristics, and then were evaluated.

Figure 8:
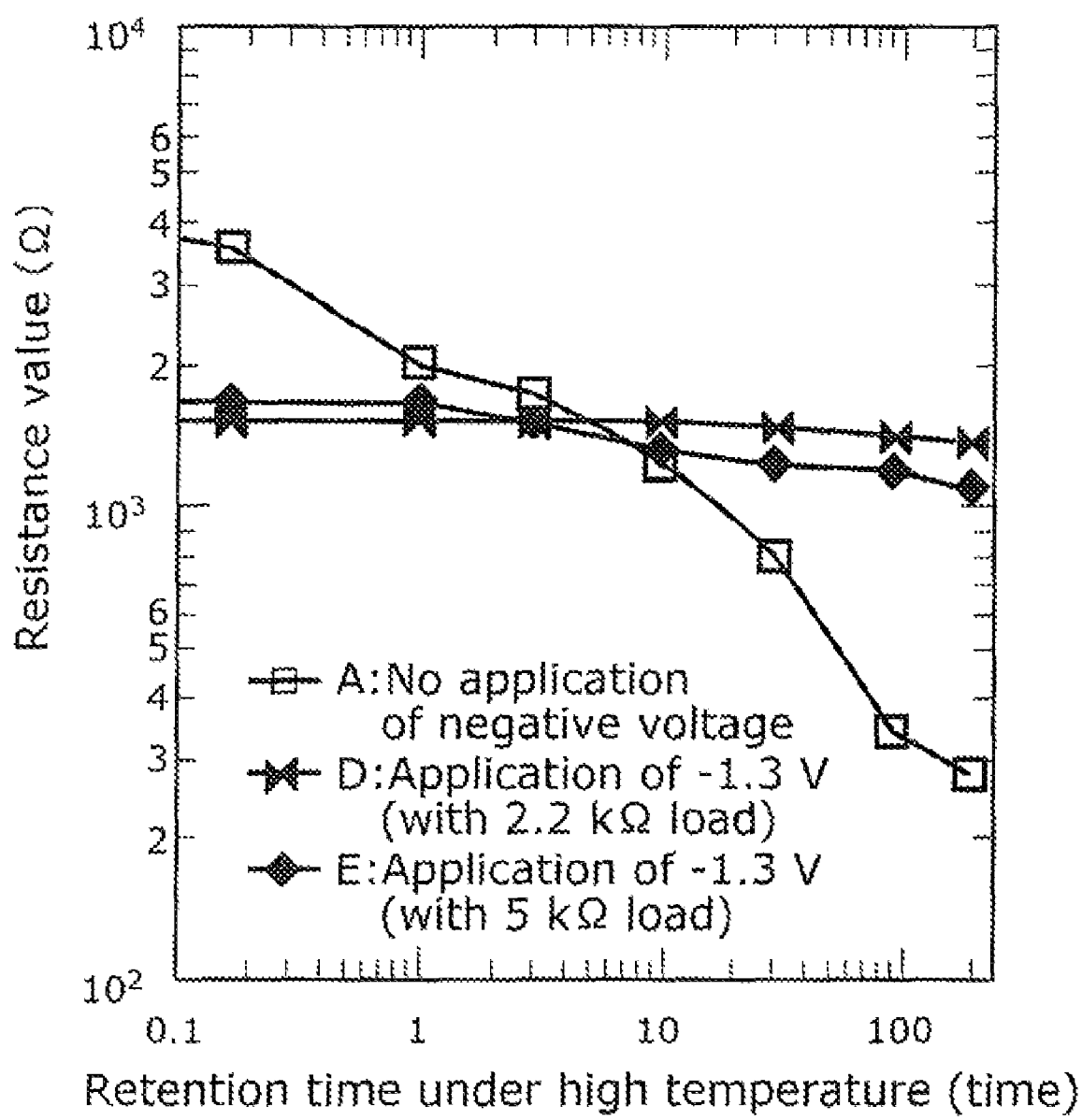
FIG. 8 illustrates the retention characteristics of resistance values of a nonvolatile memory element at 210 degrees Celsius according to Embodiment 2 in the present invention.

FIG. 8 illustrates the result of the evaluation. FIG. 8 also illustrates the result of the element A to which +1.7 V was applied to change the state to the high resistance state, for comparison. In FIG. 8, although the resistance values of the elements D and E are much lower than that of the element A in the initial state, the tendency of the resistance values is reversed between the elements D and E and the element A with the retention time of approximately 4 to 5 hours at the thermostatic chamber, and the resistance values of the elements D and E become higher than that of the element A. In addition, FIG. 8 illustrates that the resistance values of the elements D and E have almost no degradation in the time range during which the experiment was conducted. In other words, it may be said that the elements D and E to which the load resistors were connected and in which the partial write processes were performed with the application of a negative voltage have superior retention characteristics of the resistance values to those of the element A (that is, storage information).

Here, to what extent voltage is applied to the elements D and E when a voltage of −1.3 V is applied to the elements D and E with which the load resistors are respectively connected in series will be described.

First, as illustrated in FIG. 6 (a), the element D had a resistance value of 11.1 kΩ (first high resistance state) when it was not connected to the load resistor and +1.7 V was applied thereto with the 100th application of the pulse. With this state, it can be estimated that the element D is applied to a voltage of approximately −1.1 V (=−1.3V/(11.1 kΩ+2.2 kΩ)×11.1 kΩ), when the element D is connected to a load resistor having a resistance of 2.2 kΩ and −1.3 V is applied thereto. Next, when the resistance state of the element D is changed and the resistance value becomes 1.4 kΩ (second high resistance state), it can be estimated that the element D is applied to a voltage of approximately −0.5 V (=−1.3 V/(1.4 kΩ+2.2 kΩ)×1.4 kΩ)). In other words, a change probably occurred where a higher voltage was applied to the element D when the resistance value of the element D was higher, and the resistance change was automatically stopped when a voltage to be applied to the element D was lower with decrease in the resistance and the voltage was lower than a threshold (−0.5 V herein).

Thus, the third voltage to be applied to the element D in the partial write process of Embodiment 2 is found to be in a range of −1.1 V to −0.5 V inclusive.

Furthermore, it is probable that approximately −0.7 V (=−1.3V/(5.7 kΩ+5.0 kΩ)×5.7 kΩ) was applied to the element E when −1.3 V was applied, and that the resistance change ends with the application of −0.5V (=−1.3V/(3.2 kΩ+5.0 kΩ)×3.2 kΩ).

Thus, the third voltage applied to the element E in the partial write process is found to be in a range of −0.7 V to −0.5 V inclusive.

In other words, it is found that the elements D and E also had the improvement in the data retention characteristics by performing the partial write process immediately after the second writing process as described in Embodiment 1. Here, the second writing process is a process of setting the nonvolatile memory element to the first high resistance state with the application of the second voltage (+1.7 V), and the partial write process is a process in which the state of the nonvolatile memory element is changed to the second high resistance state with the application of the third voltage enough to cause the nonvolatile memory element to have the resistance state change. Furthermore, the third voltage has a polarity reverse to that of the second voltage.

In addition, the voltage to be actually applied to the nonvolatile memory element is automatically adjusted according to a resistance value of the nonvolatile memory element by connecting a load resistor in series with the nonvolatile memory element, even when an absolute value of the third voltage to be applied in the partial write process is set to a larger value. Thus, it becomes possible to prevent the decrease in a read margin due to excessively performing the partial write process.

When a nonvolatile memory element is actually used, the low resistance state and the second high resistance state have only to be associated with logical information of "0" and "1", respectively. Here, when the terminal 705 is connected to the lower electrode 103 in FIG. 1 and the terminal 706 is connected to the upper electrode 107 in FIG. 1, in order to change the state of the nonvolatile memory element 701 to the low resistance state, the nonvolatile memory element 701 has only to be set to a resistance value in the low resistance state with the application of a negative voltage with respect to the terminal 705. Furthermore, in order to change the state of the nonvolatile memory element 701 to the second high resistance state, the state thereof has only to be changed to the first high resistance state with the application of a positive voltage to the terminal 706 with respect to the terminal 705, and then a negative voltage has only to be applied to the terminal 704 with respect to the terminal 703. Here, a resistance value can be read by applying, between the terminals 705 and 706, a small voltage that does not cause the resistance change in the nonvolatile memory element 701.

Although the resistance values of load resistors connected for a partial write process are 5 kΩ and 2.2 kΩ in Embodiment 2, the values are not limited to these.

Furthermore, the partial writing method is not limited to the methods described in Embodiments 1 and 2. The most important feature of the present invention is an operation of performing a partial write process on the nonvolatile memory element whose state has been changed to the high resistance state, with application of a voltage having a smaller reverse polarity.

Figure 9:
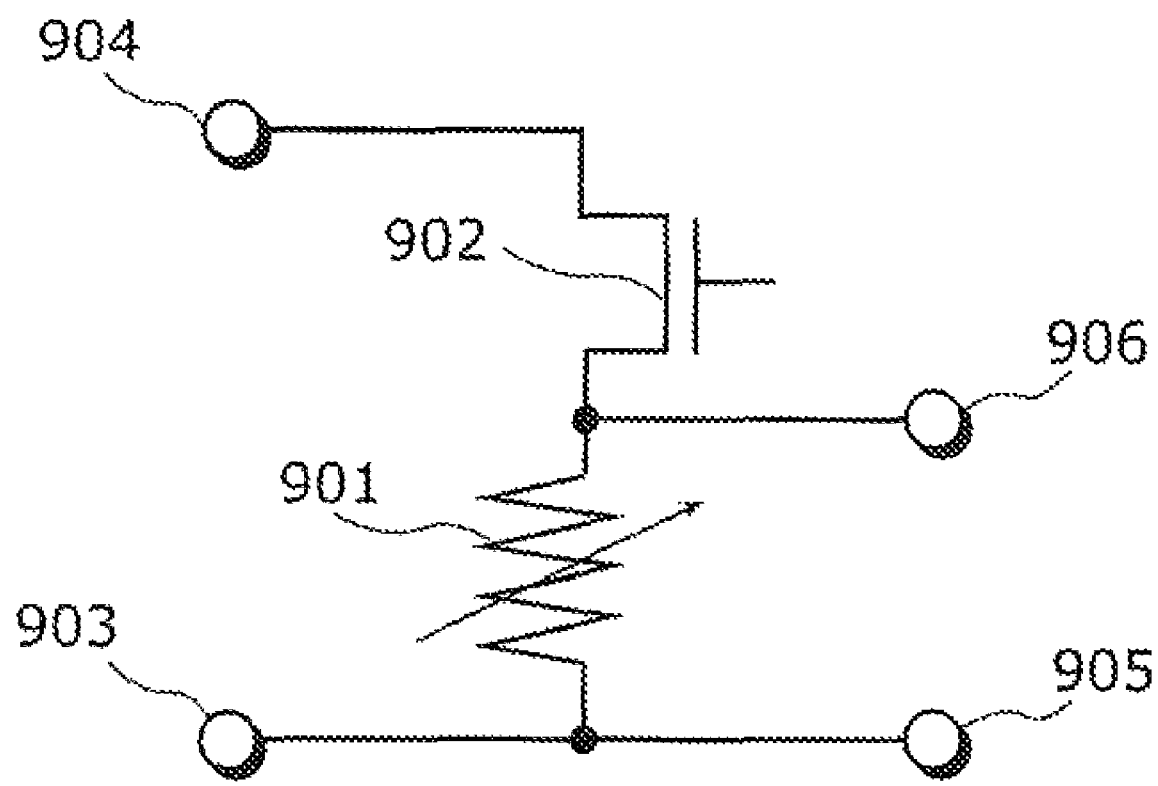
FIG. 9 illustrates a variation of a circuit when a voltage is applied to a nonvolatile memory element according to Embodiment 2 in the present invention.

For example, the partial write process may be performed in a circuit in which a transistor 902 is connected to a nonvolatile memory element 901 as illustrated in FIG. 9. In other words, a voltage to be applied to the nonvolatile memory element 901 may be adjusted by changing the resistance value of the transistor 902 with adjustment of a gate voltage of the transistor 902.

In this case, setting and reading of resistance values can be performed in the following manner. In the first writing process of setting the nonvolatile memory element 901 to the low resistance state, after the transistor 902 is set to the low resistance state (ON), a voltage having a first polarity is applied to a terminal 904 with respect to a terminal 903, or the first voltage is directly applied to the nonvolatile memory element 901 using terminals 905 and 906.

Next, in the second writing process of setting the nonvolatile memory element 901 to the first high resistance state, after the transistor 902 is set to the low resistance state, a voltage having a second polarity that is reverse to the first polarity is applied to the terminal 904 with respect to the terminal 903, or the second voltage is directly applied to the nonvolatile memory element 901 using the terminals 905 and 906.

Then, in the partial write process, after the transistor 902 is set to the high resistance state, the voltage having the first polarity is applied to the terminal 904 with respect to the terminal 903 to implement the second high resistance state. The magnitude (absolute value) of the third voltage to be applied to the nonvolatile memory element 901 as a divided voltage between the nonvolatile memory element 901 and the transistor 902 in the partial write process is smaller than that of the first voltage to be applied to the nonvolatile memory element 901 in the first writing process.

The resistance values are read by either applying a small voltage between the terminals 903 and 904 or applying the small voltage between the terminals 905 and 906 after the transistor 902 is set to the low resistance state.

Embodiment 3

Next, a nonvolatile storage device that executes a method of programming the nonvolatile memory element including the first writing process, the second writing process, and the partial write process that are described in Embodiments 1 and 2 will be described.

Figure 10:
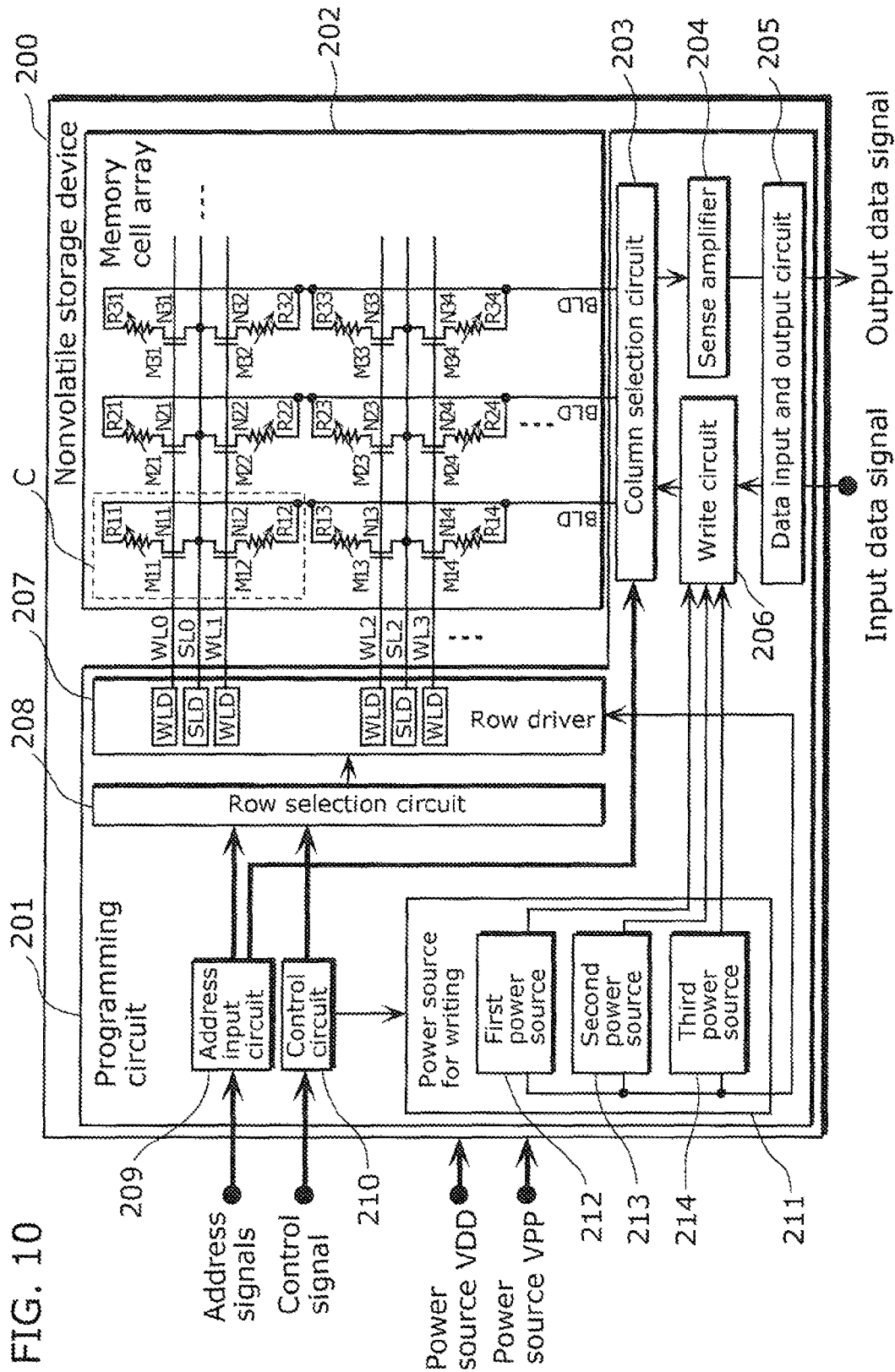
FIG. 10 illustrates an example of a circuit configuration of a nonvolatile storage device according to Embodiment 3 in the present invention.

FIG. 10 is a block diagram illustrating an example of a functional configuration of such a nonvolatile storage device.

As illustrated in FIG. 10, a nonvolatile storage device 200 includes a programming circuit 201 and a memory cell array 202.

The programming circuit 201 includes a column selection circuit 203, a sense amplifier 204, a data input and output circuit 205, a write circuit 206, a row driver 207, a row selection circuit 208, an address input circuit 209, a control circuit 210, and a power source for writing 211.

The power source for writing 211 includes a first power source 212, a second power source 213, and a third power source 214.

The memory cell array 202 includes a plurality of memory cells arranged in a matrix. In FIG. 10, although a 1T1R memory cell is exemplified as each of the memory cells in which a nonvolatile memory element (R11 to R34, . . . ) is connected in series with a selection transistor (N11 to N34, . . . ), the memory cells are not limited to the 1T1R memory cells. For example, the memory cells may be 1D1R memory cells in each of which a nonvolatile memory element is connected in series with a diode.

The nonvolatile memory elements described in Embodiment 1 or 2 are used as the nonvolatile memory elements (R11 to R34, . . . ) in Embodiment 3. The circuit diagram of FIG. 10 illustrates that one of an upper electrode and a lower electrode of the nonvolatile memory element (R11 to R34, . . . ) is electrically connected to a corresponding one of bit lines (BL0 to BL3, . . . ), and the other one of the upper electrode and the lower electrode of the nonvolatile memory element (R11 to R34, . . . ) is electrically connected to a corresponding one of source lines (SL0, SL2, . . . ) through a corresponding one of the selection transistors (N11 to N34, . . . ). The source lines (SL0, SL2, . . . ) are examples of first metal lines, and the bit lines (BL1 to BL3, . . . ) are examples of second metal lines. Here, nonvolatile memory elements in two adjacent memory cells are electrically connected to the same source line through the respective selection transistors.

The column selection circuit 203 selects a bit line connected to a memory cell to be selected, according to address signals fed to the address input circuit 209.

The row selection circuit 208 selects a source line connected to a memory cell to be selected, according to address signals fed to the address input circuit 209, and supplies an activation signal for turning on a selection transistor on a word line connected to the memory cell to be selected.

The data input and output circuit 205 receives an input data signal indicating data to be written into a nonvolatile memory element, from an external circuit that is not illustrated, and also provides an output data signal indicating data to be read from a nonvolatile memory element to the external circuit.

The first power source 212 applies a first voltage having a first polarity between the lower and upper electrodes of a nonvolatile memory element in a selected memory cell to generate a voltage to be supplied between a selected bit line and a selected source line in order to set the nonvolatile memory element to the low resistance state.

The second power source 213 applies a second voltage having a second polarity between the lower and upper electrodes of a nonvolatile memory element in a selected memory cell to generate a voltage to be supplied between a selected bit line and a selected source line in order to set the nonvolatile memory element to the first high resistance state in which a resistance value is higher than that of the low resistance state.

Here more specifically, when a voltage is applied as described in Embodiments 1 and 2 in a configuration where a lower electrode of a nonvolatile memory element is electrically connected to a source line through a selection transistor and an upper electrode is electrically connected to a bit line, the first polarity is a polarity of a negative voltage in the bit line (upper electrode) with respect to the source line (lower electrode), and the second polarity is a polarity of a positive voltage in the bit line (upper electrode) with respect to the source line (lower electrode).

The third power source 214 applies a third voltage having the first polarity between the lower and upper electrodes of a nonvolatile memory element in a selected memory cell to generate a voltage to be applied between a selected bit line and a selected source line in order to set the nonvolatile memory element to the second high resistance state.

An absolute value of the third voltage is smaller than that of the first voltage, and the resistance value in the second high resistance state is larger than that of the low resistance state and smaller than that of the first high resistance state.

Figure 7:
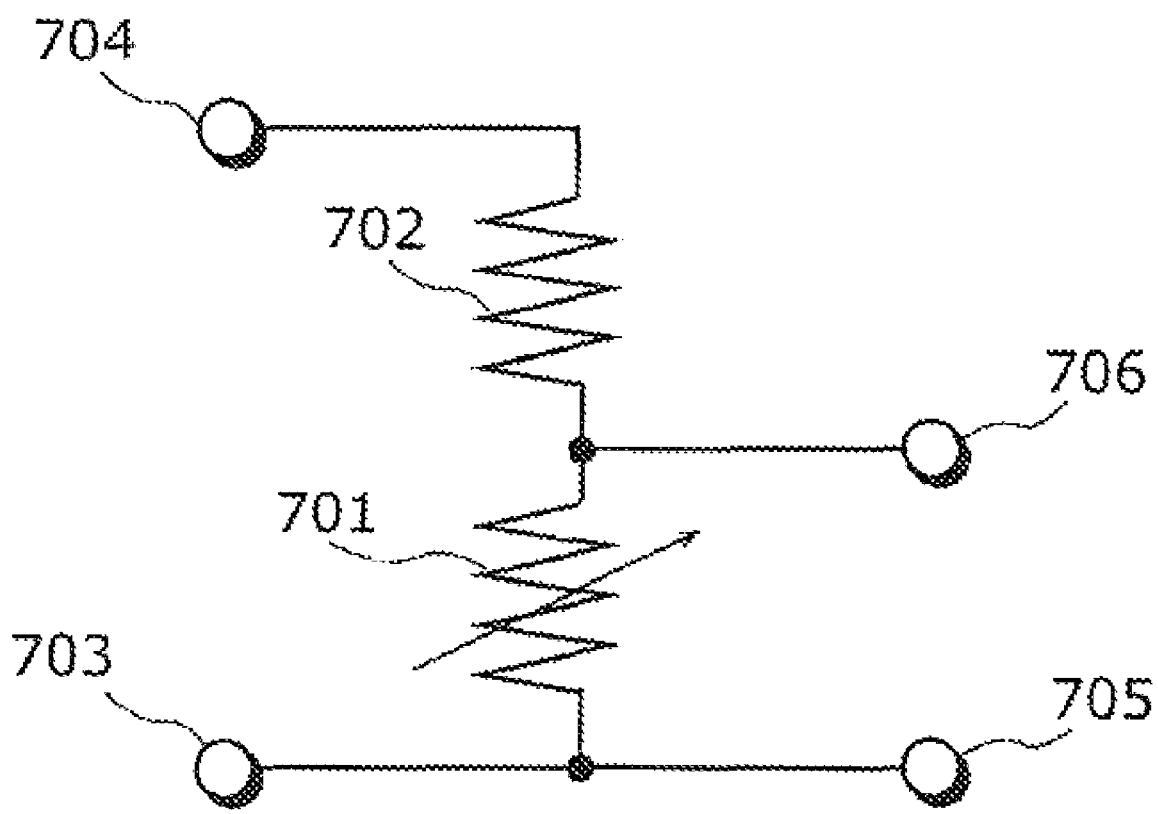
FIG. 7 illustrates a circuit diagram when a voltage is applied to a nonvolatile memory element according to Embodiment 2 in the present invention.

As described for FIGS. 7 and 9 according to Embodiment 2, a load resistor or a resistance-adjusting transistor to be connected in series with a nonvolatile memory element may be inserted into the third power source 214. The voltage generated in the third power source 214 is applied to a series circuit including a nonvolatile memory element and a load resistor.

In such a configuration, even when a higher voltage for partially writing is generated in the third power source 214, the third voltage to be actually applied to the nonvolatile memory element is automatically adjusted by the load resistor or the resistance-adjusting transistor inserted into the third power source 214 according to a resistance value of the nonvolatile memory element, thus preventing the decrease in a read margin due to excessively performing the partial write process.

The control circuit 210 controls the power source for writing 211 according to an input control signal, and causes the first power source 212 and the second power source 213 to generate a voltage for setting a nonvolatile memory element to the low resistance state and a voltage for setting the nonvolatile memory element to the first high resistance state, respectively. The generated voltages are supplied between a selected bit line and a selected word line through the write circuit 206, the column selection circuit 203, and the row driver 207. Thereby, the first writing process and the second writing process are performed.

When input data signals indicate a plurality of bit data, bit lines may be simultaneously selected, and one of the voltage generated by the first power source 212 and the voltage generated by the second power source 213 may be supplied to each of the selected bit lines, according to the bit data corresponding to the input data signals. Here, the writing operation may be performed per word.

In addition, the control circuit 210 selects a memory cell in which a nonvolatile memory element is in the first high resistance state, and causes the third power source 214 to generate a voltage for setting the nonvolatile memory element in the selected memory cell to the second high resistance state. The generated voltage is supplied between the selected bit line and the selected word line through the write circuit 206, the column selection circuit 203, and the row driver 207. Thereby, the partial write process is performed.

The configuration illustrated in FIG. 10 is a schematic example for explicitly indicating a voltage with respect to a source line. The power source for writing 211 may be anything as long as a voltage having a corresponding polarity and magnitude is applied between the selected bit line and the selected source line through the write circuit 206, the column selection circuit 203, and the row driver 207 in each of the first writing process, the second writing process, and the partial write process. Thus, the detailed circuit configuration is not limited to the one illustrated in FIG. 10.

The nonvolatile storage device 200 having such a configuration enables holding information by associating the low resistance state of a nonvolatile memory element with the first logical information and the second high resistance state of the nonvolatile memory element with the second logical information, thus forming the nonvolatile memory element that can store binary information with the favorable retention characteristics.

In order to read data (a resistance state) held in a nonvolatile memory element, a read power source that is not illustrated supplies the selected memory cell with a voltage so small that the resistance state of the nonvolatile memory element is not changed, and the sense amplifier 204 measures a current when the voltage is supplied.

For example, a threshold current corresponding to a resistance value between the second high resistance state and the low resistance state may be defined in advance, and it may be determined whether the first data or the second data is held in the nonvolatile memory element by comparing the measured current and the threshold current.

Next, several methods of executing the partial write process will be exemplified in detail.

The control circuit 210 may control the partial write process to be performed every after the second writing process or to be performed only once on a memory cell in which the nonvolatile memory element is in the first high resistance state before shutting down power supplied to the nonvolatile storage device 200 or before transition to a stand-by state (state where the power supplied to part of circuits in the nonvolatile storage device 200 is limited and the nonvolatile storage device 200 is not operating). The partial write process may be controlled only once on a memory cell in which the nonvolatile memory element is in the first high resistance state before shutting down the power supplied to the nonvolatile storage device 200 and before transition to the stand-by state. Furthermore, an external circuit (for example, a central processing unit that is not illustrated) that uses the nonvolatile storage device 200 may notify the control circuit 210 of the shutting down of power and the transition to the stand-by state using a control signal, for example.

The configuration in which the partial write process is performed every after the second writing process simplifies the control performed by the control circuit 210 and reduces the chip size; however, the time necessary to perform the high resistance processing for each time is prolonged. The configuration is suitable for, for example, a nonvolatile storage device for mobile equipment whose miniaturization is increasingly demanded rather than the speed performance.

On the other hand, the configuration in which the partial write process is performed only once before shutting down power or before transition to the stand-by state has an advantage that the time necessary to perform the first writing process for each time will not increase. The configuration is suitable for, for example, a nonvolatile storage device for a home computer whose power source is regularly shut down or which regularly transitions to the stand-by state.

Furthermore, when the partial write process is performed only once before shutting down power or before transition to the stand-by state, the control circuit 210 may detect a nonvolatile memory element in the first high resistance state, and perform the partial write process only on the detected nonvolatile memory element, or perform the partial write process on all the nonvolatile memory elements regardless of the resistance states. Even when the partial write process is performed on a nonvolatile memory element in the low resistance state, it has already been verified that there is no change in the resistance state and no negative effect including reliability.

When the control circuit 210 and the peripheral circuits are designed to perform the partial write process on all the nonvolatile memory elements, although the control circuit 210 can be simplified, the time necessary for the entire partial write process will be prolonged. In contrast, when the control circuit 210 and the peripheral circuits are designed to perform the partial write process only on a nonvolatile memory element in the first high resistance state, the time necessary for the entire partial write process can be shortened.

Furthermore, the control circuit 210 may perform the partial write process when the nonvolatile storage device 200 is in an idle state (the nonvolatile storage device 200 operates as a nonvolatile storage device but neither writes nor reads any nonvolatile memory element). The partial write process can be efficiently performed overall using the time during when neither writing operation nor reading operation is performed. The configuration is suitable for, for example, a nonvolatile storage device for a server computer which continues to operate always with the supply of a power source.

Here, whether or not the nonvolatile storage device 200 is in the idle state can be determined based on an execution state of performing the writing operation and the reading operation by the control circuit 210.

As one of the typical example operations of the nonvolatile storage device 200 having such a configuration, a case where the control circuit 210 performs the partial write process only on a nonvolatile memory element in the first high resistance state before shutting down power or before transition to the stand-by state will be hereinafter described.

Figure 11:
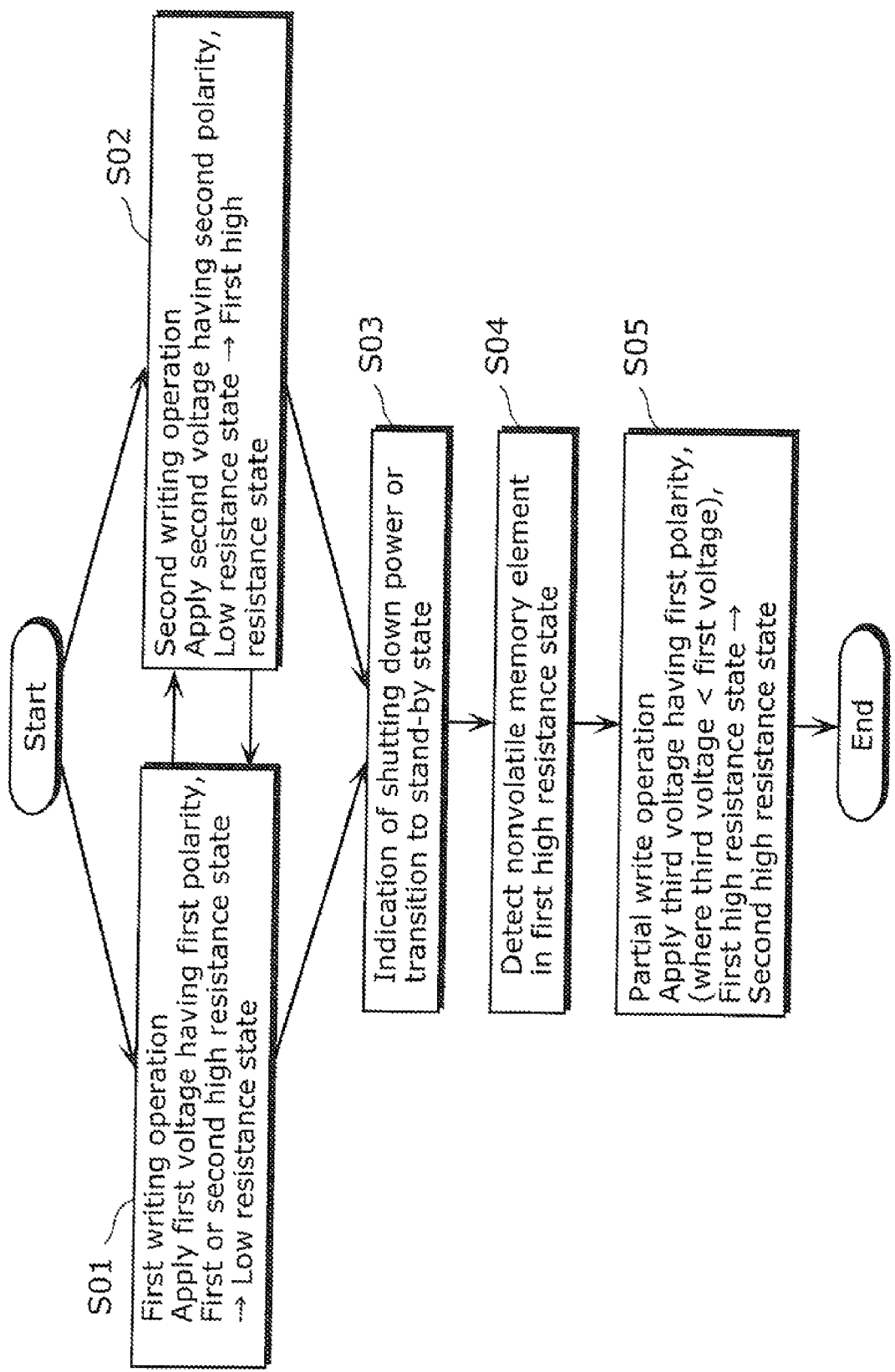
FIG. 11 is a flowchart illustrating an example of operations of a nonvolatile storage device according to Embodiment 3 in the present invention.

FIG. 11 is a flowchart illustrating a procedure example of operations of the nonvolatile storage device 200. As illustrated in FIG. 11, the nonvolatile storage device 200 performs the first writing process and the second writing process under control of the control circuit 210 (S01 and S02). Then, upon receipt of a control signal indicating shutting down power or transition to the stand-by state (S03), the control circuit 210 detects a nonvolatile memory element in the first high resistance state (S04), and performs a partial write process (S05) on the detected nonvolatile memory element.

Here, the nonvolatile memory element in the first high resistance state may be detected by, for example, defining threshold resistance between the resistance value in the first high resistance state and the resistance value in the second high resistance state, and comparing the resistance value read from the nonvolatile memory element with the threshold resistance. Furthermore, the partial write process may be performed on all bits (S05) without executing the step of detecting the nonvolatile memory element in the first high resistance state (S04).

Although Embodiments describe the case where the transition metal oxides used in variable resistance layers are a tantalum oxide, a hafnium oxide, and a zirconium oxide, the transition metal oxide layers between the lower and upper electrodes have only to include oxide layers comprising, such as tantalum, hafnium, and zirconium, as variable resistance layers in which the resistance change mainly occurs. The transition metal oxide layers may include other elements in minute amounts. In order to fine-tune a resistance value and others, the transition metal oxides may include other elements intentionally in small amounts, and such a case is also included in the scope of the present invention. Furthermore, when a resistance film is formed by sputtering, there are cases where other elements enter the resistance film in minute amounts that are not intended, due to residual gas and gas emission from a chamber wall. Obviously, the case where the other elements enter the resistance film in minute amounts is also included in the scope of the present invention.

INDUSTRIAL APPLICABILITY

The programming method of a nonvolatile memory element according to the present invention is applicable to the nonvolatile memory element used in various electronic devices, such as a digital home appliance, a memory card, a mobile phone, and a personal computer.

REFERENCE SIGNS LIST

100 Nonvolatile memory element
101 Substrate
102 Oxide layer
103 Lower electrode
104 First oxygen-deficient Ta oxide layer
105 Second oxygen-deficient Ta oxide layer
106 Variable resistance layer
107 Upper electrode
200 Nonvolatile storage device
201 Programming circuit
202 Memory cell array
203 Column selection circuit
204 Sense amplifier
205 Data input and output circuit
206 Write circuit
207 Row driver
208 Row selection circuit
209 Address input circuit
210 Control circuit
211 Power source for writing
212 First power source (for setting the low resistance state)
213 Second power source (for setting the first high resistance state)
214 Third power source (for setting the second high resistance state)
401 Lower electrode
402 First oxygen-deficient Ta oxide layer
403 Second oxygen-deficient Ta oxide layer
404 Oxygen ions
405 Upper electrode
406 Minute conduction path
407 Imperfect minute conduction path
701 Nonvolatile memory element
702 Load resistor
703 to 706 Terminal
901 Nonvolatile memory element
902 Transistor
903 to 906 Terminal

The invention claimed is:

1. A method of programming a nonvolatile memory element including a first electrode, a second electrode, and a variable resistance layer which (i) is disposed between and in contact with the first electrode and the second electrode, (ii) has a resistance state that reversibly changes based on electrical signals having different polarities and provided between the first electrode and the second electrode, and (iii) includes an oxygen-deficient transition metal oxide layer, said method comprising:
a first writing process of applying a first voltage having a first polarity between the first electrode and the second electrode so as to set the variable resistance layer to a low resistance state corresponding to first logical information;
a second writing process of applying a second voltage having a second polarity between the first electrode and the second electrode so as to set the variable resistance layer to a first high resistance state in which a resistance value is higher than a resistance value in the low resistance state, the second polarity being different from the first polarity; and
a partial write process of applying a third voltage having the first polarity between the first electrode and the second electrode after said second writing process so as to set the variable resistance layer to a second high resistance state in which a resistance value is (i) higher than the resistance value in the low resistance state and (ii) lower than the resistance value in the first high resistance state, the third voltage having an absolute value that is lower than an absolute value of the first voltage, and the second high resistance state corresponding to second logical information different from the first logical information.

2. The method of programming the nonvolatile memory element according to claim 1, wherein, in said partial write process, the nonvolatile memory element is connected in series with a load resistor to form a series circuit, and a voltage having the first polarity is applied to the series circuit, so that a divided voltage equivalent to the third voltage is applied between the first electrode and the second electrode of the nonvolatile memory element.

3. The method of programming the nonvolatile memory element according to claim 2, wherein, in said partial write process, the nonvolatile memory element is connected in series with a channel of a transistor as the load resistor to form the series circuit, and the voltage having the first polarity is applied to the series circuit in a state where a channel resistance of the transistor is set to a predetermined resistance value with an application of a predetermined voltage to a gate of the transistor, so that the divided voltage equivalent to the third voltage is applied between the first electrode and the second electrode of the nonvolatile memory element.

4. A nonvolatile storage device, comprising:
a nonvolatile memory element including a first electrode, a second electrode, and a variable resistance layer which (i) is disposed between and in contact with said first electrode and said second electrode, (ii) has a resistance state that reversibly changes based on electrical signals having different polarities and provided between said first electrode and said second electrode, and (iii) includes an oxygen-deficient transition metal oxide layer; and
a programming circuit,
wherein said programming circuit performs:
a first writing process of applying a first voltage having a first polarity between said first electrode and said second electrode so as to set said variable resistance layer to a low resistance state corresponding to first logical information;
a second writing process of applying a second voltage having a second polarity between said first electrode and said second electrode so as to set said variable resistance layer to a first high resistance state in which a resistance value is higher than a resistance value in the low resistance state, the second polarity being different from the first polarity; and
a partial write process of applying a third voltage having the first polarity between said first electrode and said second electrode after the second writing process so as to set said variable resistance layer to a second high resistance state in which a resistance value is (i)

higher than the resistance value in the low resistance state and (ii) lower than the resistance value in the first high resistance state, the third voltage having an absolute value that is lower than an absolute value of the first voltage, and the second high resistance state corresponding to second logical information different from the first logical information.

5. The nonvolatile storage device according to claim 4, wherein said first electrode and said second electrode are electrically connected to a first metal line and a second metal line, respectively, and
said programming circuit includes:
a first power source that applies a voltage between the first metal line and the second metal line, the voltage being used for applying the first voltage between said first electrode and said second electrode in the first writing process;
a second power source that applies a voltage between the first metal line and the second metal line, the voltage being used for applying the second voltage between said first electrode and said second electrode in the second writing process; and
a third power source that applies a voltage between the first metal line and the second metal line, the voltage being used for applying the third voltage between said first electrode and said second electrode in the partial write process.

6. The nonvolatile storage device according to claim 5, wherein said third power source includes a load resistor element connected in series with said nonvolatile memory element.

7. The nonvolatile storage device according to claim 6, wherein said load resistor element is a transistor connected in series with said nonvolatile memory element.

8. The nonvolatile storage device according to claim 4, wherein said variable resistance layer includes at least two oxygen-deficient transition metal oxide layers having different oxygen concentrations, and one of said at least two oxygen-deficient transition metal oxide layers having a higher oxygen concentration is in contact with one of said first electrode and said second electrode.

9. The nonvolatile storage device according to claim 4, wherein a transition metal included in said oxygen-deficient transition metal oxide layer is tantalum.

10. The nonvolatile storage device according to claim 4, wherein said programming circuit performs the partial write process after every performance of the second writing process.

11. The nonvolatile storage device according to claim 4, wherein said programming circuit performs the partial write process before shutting down power supplied to said nonvolatile storage device, before transition to a standby mode, or before shutting down the power supplied to said nonvolatile storage device and before the transition to the standby mode.

12. The nonvolatile storage device according to claim 4, wherein said nonvolatile storage device includes a plurality of nonvolatile memory elements including said nonvolatile memory element, and
said programming circuit detects one of the nonvolatile memory elements that is in the first high resistance state before shutting down the power, and performs the partial write process on the detected nonvolatile memory element.

13. The nonvolatile storage device according to claim 12, wherein said programming circuit detects the one of the nonvolatile memory elements in the first high resistance state, by defining a threshold between the resistance value in the first high resistance state and the resistance value in the second high resistance state and comparing the threshold with a resistance value read from the one of the nonvolatile memory elements.

14. The nonvolatile storage device according to claim 4, wherein said programming circuit performs the partial write process when said nonvolatile storage device is in an idle state.

15. The method of programming the nonvolatile memory element according to claim 1, wherein in said partial write process, the variable resistance layer in the first high resistance state is set to the second high resistance state.

16. The nonvolatile storage device according to claim 4, wherein in the partial write process, the variable resistance layer in the first high resistance state is set to the second high resistance state.

* * * * *